US 10,790,758 B2

United States Patent
Chung et al.

(10) Patent No.: US 10,790,758 B2
(45) Date of Patent: Sep. 29, 2020

(54) POWER CONVERTER FOR ELECTRIC VEHICLE DRIVE SYSTEMS

(71) Applicant: SF Motors, Inc., Santa Clara, CA (US)

(72) Inventors: Nathan Chung, Santa Clara, CA (US); Kangwei Mao, Santa Clara, CA (US); Zhong Nie, Santa Clara, CA (US); Duanyang Wang, Santa Clara, CA (US); Yifan Tang, Santa Clara, CA (US); Jinzhu Li, Santa Clara, CA (US)

(73) Assignees: CHONGQING JINKANG NEW ENERGY VEHICLE CO., LTD., Chongqing (CN); SF MOTORS, INC., Santa Clara, CA (US)

( * ) Notice: Subject to any disclaimer, the term of this patent is extended or adjusted under 35 U.S.C. 154(b) by 0 days.

(21) Appl. No.: 16/051,176

(22) Filed: Jul. 31, 2018

(65) Prior Publication Data

US 2019/0280610 A1   Sep. 12, 2019

Related U.S. Application Data

(60) Provisional application No. 62/640,536, filed on Mar. 8, 2018.

(51) Int. Cl.
*H02M 7/00* (2006.01)
*H01L 25/07* (2006.01)
(Continued)

(52) U.S. Cl.
CPC .............. *H02M 7/003* (2013.01); *B60L 50/51* (2019.02); *H01L 25/072* (2013.01);
(Continued)

(58) Field of Classification Search
CPC .............. H02M 7/003; H02M 7/5387; H02M 2001/0067; H01L 25/072; H01L 23/49517;
(Continued)

(56) References Cited

U.S. PATENT DOCUMENTS 3,845,661 A   11/1974   Hollweck et al.
4,382,156 A    5/1983   Jodoin
(Continued)

FOREIGN PATENT DOCUMENTS

CN   203850295     9/2014
CN   204442853 U   7/2015
(Continued)

OTHER PUBLICATIONS

International Search Report and Written Opinion for International Appl. No. PCT/CN2018/125644, dated Apr. 2, 2019.
(Continued)

*Primary Examiner* — Yemane Mehari
(74) *Attorney, Agent, or Firm* — Foley & Lardner LLP; James De Vellis

(57) ABSTRACT

Provided herein are power converter of a drive unit for an electric vehicle. The power converter includes an inverter having a first transistor, a second transistor, and a capacitor, and a laminated bus-bar having a positive bus-bar segment, a negative bus-bar segment and a phase bus-bar segment. The positive bus-bar segment, the negative bus-bar segment, and the phase bus-bar segment can be disposed about the capacitor to form a lead frame coupled with the capacitor. The lead frame can include a first lead coupled with the first transistor. The first lead can include portions of the positive bus-bar segment and the phase bus-bar segment. The lead frame can include a second lead coupled with the second transistor. The second lead can include portions of the negative bus-bar segment and the phase bus-bar segment.

20 Claims, 16 Drawing Sheets

(51) Int. Cl.
*H02M 7/5387* (2007.01)
*H05K 7/14* (2006.01)
*B60L 50/51* (2019.01)
*H02M 1/00* (2006.01)
*H01L 23/495* (2006.01)

(52) U.S. Cl.
CPC ........ *H02M 7/5387* (2013.01); *H05K 7/1432* (2013.01); *B60L 2210/40* (2013.01); *H01L 23/49517* (2013.01); *H02M 2001/0067* (2013.01); *H05K 2203/04* (2013.01)

(58) Field of Classification Search
CPC ......... H01L 2924/14; H01L 2924/3011; B60L 2210/40; B60L 11/1803; H05K 2203/04; H05K 7/1432; H05K 7/20927; H05K 7/20945
USPC ...... 363/95–98, 131, 132; 257/499; 361/760
See application file for complete search history.

(56) References Cited

U.S. PATENT DOCUMENTS

| | | | |
|---|---|---|---|
| 4,502,107 A | 2/1985 | Nilssen | |
| 4,584,768 A | 4/1986 | Tosti | |
| 5,365,424 A | 11/1994 | Deam et al. | |
| 5,371,043 A * | 12/1994 | Anderson | H01L 23/3731 |
| | | | 164/108 |
| 5,436,997 A | 7/1995 | Makiuchi et al. | |
| 5,514,906 A | 5/1996 | Love et al. | |
| 5,566,061 A | 10/1996 | Uchino | |
| 5,631,574 A | 5/1997 | Kazama | |
| 5,783,877 A | 7/1998 | Chitayat | |
| 5,804,761 A | 9/1998 | Donegan et al. | |
| 5,847,938 A | 12/1998 | Gammon | |
| 5,914,860 A | 6/1999 | Janko | |
| 6,031,751 A | 2/2000 | Janko | |
| 6,176,299 B1 | 1/2001 | Hanzlik et al. | |
| 6,272,028 B1 | 8/2001 | Satoh et al. | |
| 6,721,181 B1 | 4/2004 | Pfeifer et al. | |
| 6,822,850 B2 | 11/2004 | Pfeifer et al. | |
| 6,843,335 B2 | 1/2005 | Shirakawa et al. | |
| 7,012,810 B2 | 3/2006 | Parkhill et al. | |
| 7,046,535 B2 | 5/2006 | Rodriguez et al. | |
| 7,113,405 B2 | 9/2006 | Armstrong et al. | |
| 7,292,451 B2 | 11/2007 | Rodriguez et al. | |
| 7,505,294 B2 | 3/2009 | Ahmed et al. | |
| 7,551,439 B2 | 6/2009 | Peugh et al. | |
| 7,557,298 B2 | 7/2009 | Vanhoutte et al. | |
| 7,714,230 B2 | 5/2010 | Beulque | |
| 7,742,303 B2 | 6/2010 | Azuma et al. | |
| 7,742,307 B2 * | 6/2010 | Ellsworth | H05K 1/0204 |
| | | | 361/699 |
| 7,777,433 B2 | 8/2010 | Yamaguchi et al. | |
| 7,940,526 B2 | 5/2011 | Schulz-Harder et al. | |
| 7,965,510 B2 | 6/2011 | Suzuki et al. | |
| 7,969,735 B2 | 6/2011 | Nakatsu et al. | |
| 8,059,404 B2 | 11/2011 | Miller et al. | |
| 8,391,008 B2 | 3/2013 | Dede | |
| 8,400,791 B2 | 3/2013 | Campbell et al. | |
| 8,519,561 B2 | 8/2013 | Azuma et al. | |
| 8,575,882 B2 | 11/2013 | Radosevich | |
| 8,675,376 B2 | 3/2014 | Campbell et al. | |
| 8,730,672 B2 | 5/2014 | Ebersberger et al. | |
| 8,773,007 B2 | 7/2014 | Van De Ven et al. | |
| 8,780,557 B2 | 7/2014 | Duppong et al. | |
| 8,888,506 B2 | 11/2014 | Nishimura et al. | |
| 8,947,899 B2 | 2/2015 | Savatski et al. | |
| 8,952,525 B2 | 2/2015 | Ide et al. | |
| 9,007,767 B2 | 4/2015 | Nakajima | |
| 9,225,263 B2 | 12/2015 | Radosevich | |
| 9,247,679 B2 | 1/2016 | Joshi et al. | |
| 9,247,697 B2 | 2/2016 | Chen et al. | |
| 9,439,332 B2 | 9/2016 | Ide et al. | |
| 9,445,526 B2 | 9/2016 | Zhou et al. | |
| 9,565,792 B2 | 2/2017 | Ishikawa et al. | |
| 9,578,788 B2 | 2/2017 | Tang et al. | |
| 9,647,361 B2 | 5/2017 | Kobuchi et al. | |
| 10,021,811 B2 | 7/2018 | Schaltz et al. | |
| 10,122,294 B2 * | 11/2018 | Xu | H02M 1/32 |
| 10,215,504 B2 | 2/2019 | Coteus et al. | |
| 10,236,786 B2 | 3/2019 | Liu et al. | |
| 10,236,791 B1 * | 3/2019 | Chung | H02M 7/53871 |
| 10,594,230 B2 | 3/2020 | Chung et al. | |
| 2003/0111714 A1 * | 6/2003 | Bates | H01L 23/66 |
| | | | 257/678 |
| 2003/0133257 A1 | 7/2003 | Beihoff et al. | |
| 2003/0218057 A1 | 11/2003 | Joseph et al. | |
| 2004/0060692 A1 | 4/2004 | Pfeifer et al. | |
| 2004/0227231 A1 * | 11/2004 | Maly | H01L 25/072 |
| | | | 257/724 |
| 2004/0228094 A1 * | 11/2004 | Ahmed | H01L 25/072 |
| | | | 361/702 |
| 2006/0092611 A1 | 5/2006 | Beihoff et al. | |
| 2006/0274561 A1 | 12/2006 | Ahmed et al. | |
| 2006/0291165 A1 | 12/2006 | Flesch et al. | |
| 2007/0236883 A1 | 10/2007 | Ruiz | |
| 2007/0246351 A1 | 10/2007 | Smola et al. | |
| 2007/0252169 A1 | 11/2007 | Tokuyama et al. | |
| 2008/0247139 A1 | 10/2008 | Stahlhut et al. | |
| 2008/0316710 A1 | 12/2008 | Seto et al. | |
| 2009/0129011 A1 | 5/2009 | Balzano | |
| 2010/0025126 A1 | 2/2010 | Nakatsu et al. | |
| 2010/0026090 A1 | 2/2010 | Nakatsu et al. | |
| 2010/0277868 A1 | 11/2010 | Beaupre et al. | |
| 2010/0290190 A1 | 11/2010 | Chester et al. | |
| 2012/0325447 A1 | 12/2012 | You et al. | |
| 2013/0114210 A1 | 5/2013 | Ebersberger et al. | |
| 2013/0146253 A1 | 6/2013 | Daly | |
| 2013/0146254 A1 | 6/2013 | Jeon et al. | |
| 2013/0235527 A1 * | 9/2013 | Wagner | H05K 1/0203 |
| | | | 361/702 |
| 2014/0133150 A1 | 5/2014 | Pardikes et al. | |
| 2014/0262177 A1 | 9/2014 | Tang et al. | |
| 2014/0307389 A1 | 10/2014 | Arvelo et al. | |
| 2014/0345492 A1 | 11/2014 | Fujito et al. | |
| 2014/0347817 A1 | 11/2014 | Joshi et al. | |
| 2014/0369099 A1 | 12/2014 | Asako | |
| 2015/0003019 A1 | 1/2015 | Ide et al. | |
| 2015/0021756 A1 | 1/2015 | Adachi | |
| 2015/0289391 A1 | 10/2015 | Nakatsu et al. | |
| 2016/0155572 A1 | 6/2016 | Ramm et al. | |
| 2016/0156278 A1 | 6/2016 | Ramm et al. | |
| 2016/0183409 A1 | 6/2016 | Zhou et al. | |
| 2016/0242312 A1 | 8/2016 | Singh et al. | |
| 2017/0028869 A1 | 2/2017 | Boddakayala et al. | |
| 2017/0330815 A1 | 11/2017 | Mische et al. | |
| 2018/0184538 A1 | 6/2018 | Bayerer | |
| 2018/0184543 A1 | 6/2018 | Ando et al. | |
| 2018/0198378 A1 * | 7/2018 | Xu | H01L 25/072 |
| 2018/0206359 A1 * | 7/2018 | McPherson | H05K 7/1432 |
| 2018/0330895 A1 | 11/2018 | Nagayoshi et al. | |
| 2019/0296656 A1 | 9/2019 | Chung et al. | |
| 2019/0296657 A1 | 9/2019 | Chung et al. | |
| 2019/0296658 A1 | 9/2019 | Chung et al. | |
| 2019/0335607 A1 | 10/2019 | Song et al. | |
| 2019/0335608 A1 | 10/2019 | Song et al. | |

FOREIGN PATENT DOCUMENTS

| | | |
|---|---|---|
| CN | 106656021 A | 5/2017 |
| CN | 106848118 A | 6/2017 |
| CN | 107769604 A | 3/2018 |

OTHER PUBLICATIONS

Non-Final Office Action on U.S. Appl. No. 16/051,182 dated Nov. 2, 2018.
Non-Final Office Action on U.S. Appl. No. 16/051,190 dated Mar. 13, 2019.
Non-Final Office Action on U.S. Appl. No. 16/051,193 dated Apr. 9, 2019.

(56) References Cited

OTHER PUBLICATIONS

Non-Final Office Action on U.S. Appl. No. 16/110,425 dated Apr. 11, 2019.
Non-Final Office Action on U.S. Appl. No. 16/110,475 dated Mar. 13, 2019.
Non-Final Office Action on U.S. Appl. No. 16/110,513 dated May 13, 2019.
Non-Final Office Action on U.S. Appl. No. 16/110,559 dated Feb. 25, 2019.
Non-Final Office Action on U.S. Appl. No. 16/232,981 dated Mar. 13, 2019.
Non-Final Office Action on U.S. Appl. No. 16/233,028 dated Apr. 9, 2019.
Non-Final Office Action on U.S. Appl. No. 16/233,826 dated Apr. 11, 2019.
Non-Final Office Action on U.S. Appl. No. 16/233,842 dated Mar. 13, 2019.
Non-Final Office Action on U.S. Appl. No. 16/234,242 dated Feb. 25, 2019.
Notice of Allowance on U.S. Appl. No. 16/051,182 dated Jan. 3, 2019.
Notice of Allowance on U.S. Appl. No. 16/051,991 dated May 20, 2019.
Notice of Allowance on U.S. Appl. No. 16/234,238 dated Feb. 20, 2019.
International Search Report and Written Opinion for PCT/CN2019/079353 dated Jul. 1, 2019 (11 pages).
International Search Report and Written Opinion on PCT/CN2019/079350 dated Jul. 3, 2019 (11 pages).
International Search Report and Written Opinion on PCT/CN2019/079352 dated Jun. 8, 2019 (11 pages).
Notice of Allowance on U.S. Appl. No. 16/232,981 dated Aug. 13, 2019.
Notice of Allowance on U.S. Appl. No. 16/232,981 dated Dec. 17, 2019 (10 pages).
Final Office Action on U.S. Appl. No. 16/110, 475 dated Sep. 17, 2019 (17 pages).
International Search Report and Written Opinion on PCT Appln. Ser. No. PCT/CN2018/125644 dated Apr. 2, 2019 (9 pages).
Notice of Allowance on U.S. Appl. No. 16/051,190 dated Nov. 26, 2019 (2 pages).
Notice of Allowance on U.S. Appl. No. 16/051,190 dated Nov. 7, 2019 (10 pages).
Notice of Allowance on U.S. Appl. No. 16/051,991 dated Sep. 18, 2019 (9 pages).
Notice of Allowance on U.S. Appl. No. 16/110,475 dated Nov. 22, 2019 (8 pages).
Notice of Allowance on U.S. Appl. No. 16/110,513 dated Oct. 17, 2019 (2 pages).
Notice of Allowance on U.S. Appl. No. 16/110,513 dated Sep. 4, 2019 (9 pages).
Notice of Allowance on U.S. Appl. No. 16/233,842 dated Nov. 20, 2019 (8 pages).
Notice of Allowance on U.S. Appl. No. 16/233,842 dated Sep. 18, 2019 (11 pages).
Notice of Allowance on U.S. Appl. No. 16/234,242 dated Oct. 24, 2019 (11 pages).
Final Office Action on U.S. Appl. No. 16/110,559 dated Dec. 26, 2019 (18 pages).
Notice of Allowance on U.S. Appl. No. 16/051,193 dated Jan. 10, 2020 (9 pages).
Notice of Allowance on U.S. Appl. No. 16/051,991 dated Jan. 22, 2020 (10 pages).
Notice of Allowance on U.S. Appl. No. 16/110,425 dated Jan. 16, 2020 (8 pages).
Notice of Allowance on U.S. Appl. No. 16/110,513 dated Jan. 2, 2020 (9 pages).
Notice of Allowance on U.S. Appl. No. 16/110,559 dated Mar. 30, 2020 (9 pages).
Notice of Allowance on U.S. Appl. No. 16/233,028 dated Jan. 16, 2020 (9 pages).
Notice of Allowance on U.S. Appl. No. 16/233m826 dated Jan. 30, 2020 (9 pages).
Notice of Allowance on U.S. Appl. No. 16/233,842 dated Dec. 20, 2019 (4 pages).
Notice of Allowance on U.S. Appl. No. 16/234,242 dated Mar. 16, 2020 (9 pages).
Non-Final Office Action on U.S. Appl. No. 16/131,459 dated Apr. 16, 2020 (16 pages).
Notice of Allowance on U.S. Appl. No. 16/232,981 dated Apr. 24, 2020 (10 pages).

\* cited by examiner

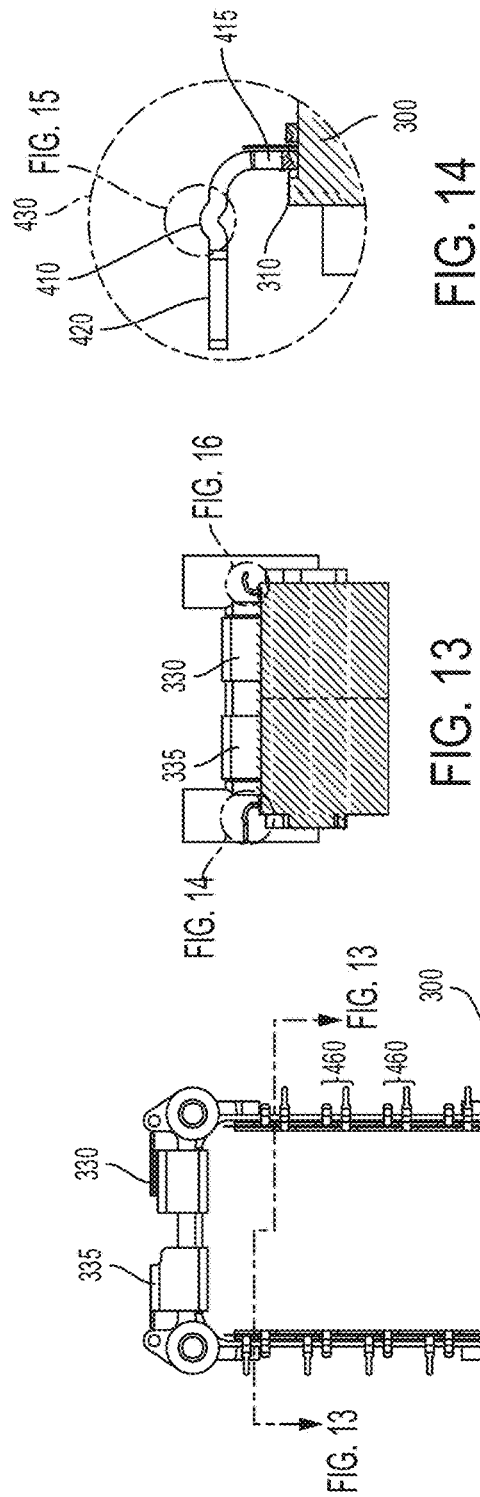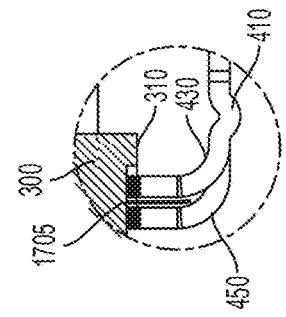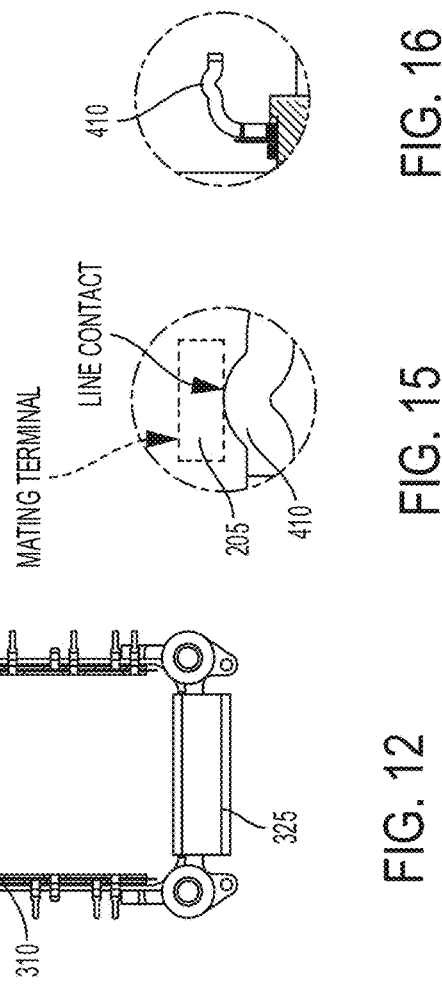

POWER CONVERTER FOR ELECTRIC VEHICLE DRIVE SYSTEMS

CROSS REFERENCE TO RELATED APPLICATIONS

The present application claims the benefit of priority under 35 U.S.C. § 119(e) to U.S. Provisional Application 62/640,536, titled "INVERTER AND CAPACITOR PACKAGE FOR ELECTRIC VEHICLE DRIVE SYSTEMS", filed on Mar. 8, 2018. The entire disclosure of which is incorporated herein by reference in its entirety.

BACKGROUND

Vehicles such as automobiles have power requirements to operate the vehicle and associated or peripheral systems. The power source can include onboard batteries or fuel cells, gasoline or other fossil fuel or plant based fuels, as well as combinations thereof.

SUMMARY

The present disclosure is directed a power converter component to power a drive unit of an electric vehicle drive system. The power converter component includes an inverter and a laminated bus-bar assembly integrated with a lead frame of a capacitor of the inverter.

In at least one aspect, a power converter component to power a drive unit of an electric vehicle is provided. The power converter component includes an inverter having a first transistor, a second transistor, and a capacitor. The power converter can include a laminated bus-bar having a positive bus-bar segment, a negative bus-bar segment and a phase bus-bar segment. The positive bus-bar segment, the negative bus-bar segment, and the phase bus-bar segment can be disposed about the capacitor to form a lead frame coupled with the capacitor. The lead frame can include a first lead coupled with the first transistor. The first lead can include a portion of the positive bus-bar segment and a first portion of the phase bus-bar segment. The lead frame can include a second lead coupled with the second transistor. The second lead can include a portion of the negative bus-bar segment and a second portion the phase bus-bar segment.

In at least one aspect, a method of providing a power converter component to power a drive unit of an electric vehicle is provided. The method can include providing an inverter. The inverter can have a first transistor, a second transistor, and a capacitor. The method can include forming a laminated bus-bar having a positive bus-bar segment, a negative bus-bar segment and a phase bus-bar segment. The method can include disposing the positive bus-bar segment, the negative bus-bar segment, and the phase bus-bar segment about the capacitor to form a lead frame coupled with the capacitor. The method can include coupling a first lead of the lead frame with the first transistor. The first lead can include a portion of the positive bus-bar and a first portion of the phase bus-bar. The method can include coupling the second lead of the lead frame with the second transistor. The second lead can include a portion of the negative bus-bar and a second portion the phase bus-bar.

In at least one aspect, a method is provided that includes providing a power converter component to power a drive unit of an electric vehicle. The power converter component can include an inverter. The inverter can have a first transistor, a second transistor, and a capacitor, and a laminated bus-bar having a positive bus-bar segment, a negative bus-bar segment and a phase bus-bar segment. The positive bus-bar segment, the negative bus-bar segment, and the phase bus-bar segment can be disposed about the capacitor to form a lead frame coupled with the capacitor. The lead frame can include a first lead coupled with the first transistor, the first lead including a portion of the positive bus-bar and a first portion of the phase bus-bar. The lead frame can include a second lead coupled with the second transistor, the second lead including a portion of the negative bus-bar and a second portion the phase bus-bar.

In at least one aspect, a power converter component to power a drive unit of an electric vehicle is provided. The power converter component can include a capacitor having a capacitor lead frame and a first transistor coupled with a first surface of the capacitor lead frame. The first transistor can have a first plurality of transistor leads that extend from a first side surface of the capacitor lead frame. A second transistor can be coupled with the first surface of the capacitor lead frame. The second transistor can have a second plurality of transistor leads that extend from a second side surface of the capacitor lead frame. The power converter component can include a first input terminal coupled with a first edge surface of the capacitor and a second input terminal coupled with the first edge surface of the capacitor. The second input terminal can be spaced from the first input terminal a first distance along the first edge surface of the capacitor. The power converter component can include an output terminal coupled with a second edge surface of the capacitor.

In at least one aspect, a method of providing a power converter component to power a drive unit of an electric vehicle is provided. The method can include providing a capacitor having a capacitor lead frame and coupling a first transistor with a first surface of the capacitor lead frame. The first transistor can have a first plurality of transistor leads extending from a first side surface of the capacitor lead frame, and coupling a second transistor with the first surface of the capacitor lead frame. The second transistor can have a second plurality of transistor leads extending from a second side surface of the capacitor lead frame. The method can include forming a first input terminal on a first edge surface of the capacitor and forming a second input terminal on the first edge surface of the capacitor. The second input terminal can be spaced from the first input terminal a first distance along the first edge surface of the capacitor. The method can include forming an output terminal on a second edge surface of the capacitor.

In at least one aspect a method for providing a power converter component to power a drive unit of an electric vehicle is provided. The power converter component can include a capacitor having a capacitor lead frame, and a first transistor coupled with a first surface of the capacitor lead frame. The first transistor can have a first plurality of transistor leads extending from a first side surface of the capacitor lead frame, and a second transistor coupled with the first surface of the capacitor lead frame. The second transistor can have a second plurality of transistor leads extending from a second side surface of the capacitor lead frame. The power converter component can include a first input terminal coupled with a first edge surface of the capacitor and a second input terminal coupled with the first edge surface of the capacitor. The second input terminal can be spaced from the first input terminal a first distance along the first edge surface of the capacitor. The power converter component can include an output terminal coupled with a second edge surface of the capacitor.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings:

FIGS. 12-17 depict example views of capacitor leads of a capacitor lead frame;

Following below are more detailed descriptions of various concepts related to, and implementations of, methods, apparatuses, and systems of providing power converter components to power a drive unit of an electric vehicle. The various concepts introduced above and discussed in greater detail below may be implemented in any of numerous ways, as the described concepts are not limited to any particular manner of implementation.

DETAILED DESCRIPTION

Following below are more detailed descriptions of various concepts related to, and implementations of power converter components to power a drive unit of an electric vehicle. The various concepts introduced above and discussed in greater detail below can be implemented in any of numerous ways.

Battery cells for higher power, higher voltage battery packs, support applications in vehicles such as automobiles, plug-in hybrid electrical vehicles (PHEVs), hybrid electrical vehicles (HEVs), electrical vehicle (EV) systems, or stationary energy storage, for example. Challenges with increasing the capacity at the battery cell level include packaging efficiency. Systems and methods are described herein directed towards a power converter component to power a drive unit of an electric vehicle of an electric vehicle. The electric vehicle can include a fully electric vehicle or a hybrid electric vehicle. The power converter component can include an inverter and a laminated bus-bar assembly integrated with a lead frame of a capacitor of the inverter.

The laminated bus-bar assembly can be formed such that it is integrated with, includes portions of, or forms the lead frame of the capacitor. The laminated bus-bar can include a positive bus-bar, a negative bus-bar, and a phase bus-bar. Each of the positive bus-bar, the negative bus-bar, and the phase bus-bar can be disposed about the capacitor to form the lead frame of the capacitor. The capacitor lead frame can be coupled (e.g., coupled directly or indirectly) with lead frames of one or more transistors to form a half bridge inverter circuit. Portions of the positive bus-bar, negative bus-bar, and the phase bus-bar can form leads or connection points of the lead frame and couple with the transistor lead frames. Thus, the laminated bus-bar assembly as described herein may not include or use an intermediate bus-bar between the capacitor lead frame and the transistor lead frames. Instead, the capacitor lead frame can be coupled (e.g., directly) with the transistor lead frames. For example, the capacitor and portions of the positive bus-bar, portions of the negative bus-bar and portions of the phase bus-bar can be formed as one homogenous part, sharing structure, insulation, mounting points, or heat dissipation surfaces. The mechanical tolerance stack up between the capacitor and positive bus-bar, the negative bus-bar, and the phase bus-bar can be reduced or eliminated.

Figure 1:
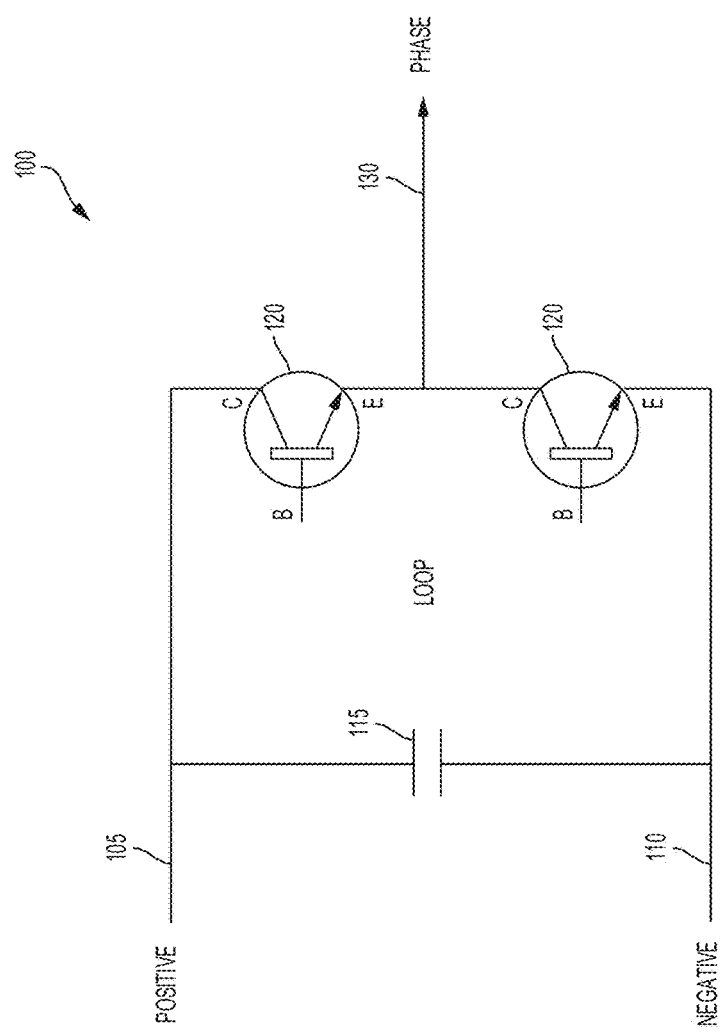
FIG. 1 depicts an example schematic of a half-bridge inverter circuit of a half-bridge module having a capacitor coupled with two transistors, according to an illustrative implementation.

For example, FIG. 1 depicts an example half-bridge inverter circuit 100 having a positive terminal 105 (which can also be referred to herein as a positive input, positive input terminal) and a negative terminal 110 (which can also be referred to herein as a negative input, negative input terminal) forming a loop. The half-bridge inverter circuit can include a capacitor 115 coupled between the positive terminal 105 and the negative terminal 110.

The half-bridge inverter circuit 100 can include a first transistor 120 and a second terminal 120 coupled between the positive terminal 105, the negative terminal 110 and a phase terminal 130. For example, the first transistor 120 can include a base terminal, a collector terminal coupled with the positive terminal 105. The first transistor 120 can further include an emitter terminal coupled with a phase terminal 130. The first transistor 120 can further include a collector terminal of a second transistor 120. The second transistor 120 can further include a base terminal and an emitter terminal. The emitter terminal can be coupled with the negative terminal 110. The first transistor 120 and the second transistor 120 can operate as switches and provide a phase voltage through the phase terminal 130, for example, to a three phase motor or motor drive unit of an electrical vehicle.

The half-bridge inverter circuit 100 provides a closed inductance loop between the capacitor 115 (e.g., a DCLSP capacitor) and first and second transistors 120 (e.g., TO-247 transistors, switches), where the lead frame of the capacitor 115 can be electrically coupled (e.g., make electrical connections) directly to lead frames of the first and second transistors 120. The half-bridge circuit 100 can be formed such that a distance between first and second transistors 120 (e.g., IGBT semiconductor die) and the capacitor 115 (e.g., filtering capacitor film elements) is minimized. By coupling the lead frame of the capacitor 115 with the lead frame of the first and second transistors 120, the inductance loop can have a reduced size. For example, the lead frame of the capacitor 115 can be coupled directly with the lead frame of the first transistor 120 or the second transistor 120 such that they are in contact or such that a distance between them is zero. A distance between a lead or finger portion of the lead frame of the capacitor 115 and a body portion of the first transistor 120 or the second transistor 120 can be in a range from 0 mm (e.g., in contact) to 15 mm. The distance between a lead or finger portion of the lead frame of the capacitor 115 and a body portion of the first transistor 120 or the second transistor 120 can be 11 mm.

The arrangement or positioning of the capacitors 115, the positive terminal 105, the negative terminal 110, first transistor 120, second transistor 120, and the phase terminal 130 can be selected to minimize the size of the inductance loop present in the half-bridge circuit 100. For example, the lead frame of the first and second transistors 120 can couple directly with the lead frame of the capacitor 115 to reduce the spacing between the first and second transistors 120 and the capacitor 120. Thus, the arrangement or positioning of the capacitors 115, the positive terminal 105, the negative terminal 110, first transistor 120, second transistor 120, and the phase terminal 130 can be selected to minimize distance and maintain equidistance between the capacitor 115 and the first and second transistors 120 for both the high side and low side. The reduced size and the reduced spacing of the elements of the half-bridge inverter circuit 100 can reduce electrical loss or have minimal electrical loss and the electrical loss can be uniform across the first transistor 120 and the second transistor 120.

The leads of the first and second transistors 120 can be unbent, and terminated to or otherwise coupled with the capacitor 115 using resistive welding, among other techniques. Thus, the lead length of the first and second transistors 120 before the weld termination can be minimized. For example, the straight and unbent leads of first and second transistors 120 that can be short in length to minimize parasitic inductance effects, relative to alternative designs where more of the transistor lead is utilized or the leads are bent to reach their target connections. For example, the leads of the first and second transistors 120 can have a length in a range from 4 mm to 10 mm (e.g., 8 mm). The capacitor 115 can include DC-Link, Single-Phase Capacitors ("DCLSP Capacitors") used as X capacitors, DC-Link filtering capacitors or automotive, industrial, or commercial inverters. The bus-bars in the capacitor can serve as the conducting paths indicated in FIG. 1.

Figure 2:
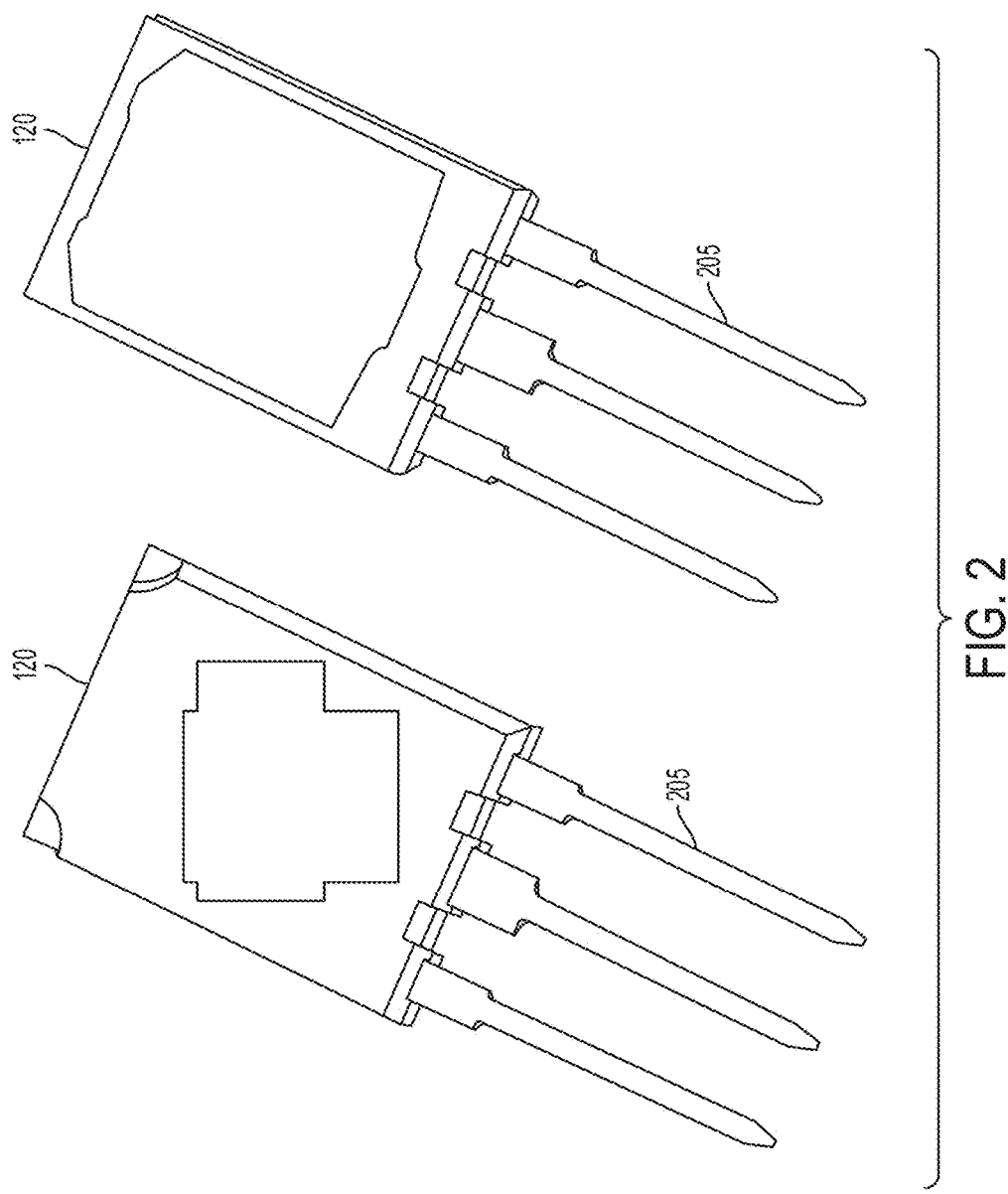
FIG. 2 depicts from and back views of an example transistor used in a half-bridge module, according to an illustrative implementation.

FIG. 2 depicts an example front and a back view of the transistor 120 is provided. The transistor 120 may include a TO-247 transistor or a TO-247 discreet IGBT package. The transistors can include a variety of different transistors. The transistor 120 can include a semiconductor device having one or more connections. For example, and as depicted in FIG. 1, the transistor 120 can include a base terminal, a collector terminal, and an emitter terminal. Each of the transistors 120 can include one or more leads 205. For example, each of the transistors 120 may include three leads 205. Each of the three leads 205 can corresponds to at least one of the terminals of the transistor 120. For example, a first lead 205 can correspond to the base terminal or base lead. A second lead 205 can correspond to the collector terminal or collector lead. A third lead 205 can correspond to the emitter terminal or emitter lead. The leads 205 can receive or provide a voltage signal or a current signal.

Figure 3:
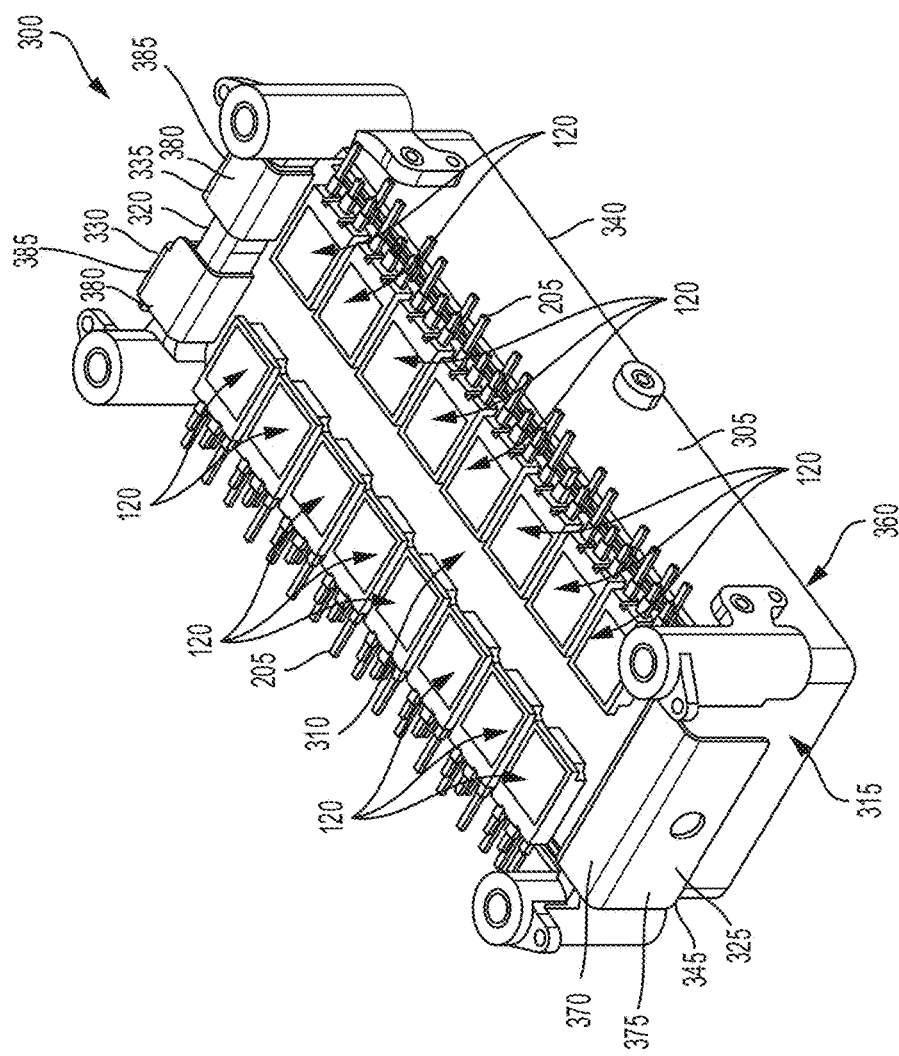
FIG. 3 depicts an example diagram of inverter, according to an illustrative implementation.

FIG. 3 depicts an example inverter 300 (also referred to herein as a capacitor package) includes a DC bus or DC terminal and an AC bus or AC terminal coupled with a plurality of transistors 120. For example, the inverter 300 can include a first input terminal 330 corresponding to a first DC input terminal and a second input terminal 335 corresponding to a second DC input terminal. The inverter 300 can include a phase terminal 325 (e.g., output terminal) corresponding to an AC output terminal. Thus, the inverter 300 can couple, combine or consolidate the DC bus-bars and the AC bus-bar with each other and couple the DC bus and AC bus with the plurality of transistors 120.

The inverter 300 can define a capacitor housing 305 having a first surface 310 (e.g., top surface, bottom surface), a second surface 360 (e.g., bottom surface, top surface), a first side surface 340, a second side surface 345, a first edge surface 315 and a second edge surface 320. The capacitor housing 305 or capacitor case can provide a positive bus-bar, a negative bus-bar, and a phase bus-bar with the structural backing or support needed to compress power converter components, such as but not limited to, thermal pads against heat dissipation surfaces of the power converter component. The first surface 310, the second surface 360, the side surfaces 340, 345, and edge surfaces 315, 320 can be formed as one integral element. For example, the first surface 310, the second surface 360, the side surfaces 340, and edge surfaces 315, 320 can be molded together to form one unit or one structure. The first surface 310, the second surface 360, the side surfaces 340, 345 and edge surfaces 315, 320 can be formed as individual elements and coupled together. For example, the first surface 310, the second surface 360, the side surfaces 340, and edge surfaces 315, 320 can couple together using fasteners, bolts, welded connections, or soldered connections. The inverter 300 can operate as a single phase capacitor package of a multiple phase inverter module (e.g., power module) for an electric vehicle. For example, a multiple phase inverter module can include three capacitor packages 300 to form a three phase inverter module for a drive unit of an electric vehicle. The inverter housing 305 can include or be formed from non-conductive material or plastic material. For example, the inverter housing (or capacitor case) can be formed from injection-molded, glass-filled polymer. A potting compound (e.g., epoxy resin) can be used to encase the bus-bars (e.g., positive bus-bar, negative bus-bar, phase bus-bar) and the capacitor bobbin of the capacitor 115 during the injection molding process to form the inverter housing 305. The inverter housing 305 can have a length in a range from 160 mm to 170 mm (e.g., 164 mm). The inverter housing 305 can have a width in a range from 60 mm to 70 mm (e.g., 66 mm). The inverter housing 305 can have a height in a range from 30 mm to 40 mm (e.g., 36 mm).

The first edge surface 315 can include a phase terminal 325. The phase terminal 325 can be configured as an output terminal of the inverter 300. The phase terminal 325 can include conductive material, such as but not limited to copper. The phase terminal 325 can be formed in a variety of different shapes to accommodate coupling with transistor lead frames or coupling with other inverters 300 within a drive train of an electrical vehicle. The phase terminal 325 can be formed having a straight shape, or a curved or bent shape to accommodate coupling over portions of the first surface 310 or edge surfaces 315, 320 of the capacitor housing 305 (see also terminal 830 of FIG. 8). As depicted in FIG. 3, the phase terminal 325 can include a first portion 370 that is parallel with the first surface 310 and a second portion 375 that is perpendicular with respect to the first surface 310 and parallel with the edge surface 315. For example, the phase terminal 325 can have a "U" shape. The phase terminal 325 can couple with a phase bus-bar (not shown) to provide power generated by inverter 300 to other electrical components of an electric vehicle.

The second edge surface 320 can include the first input terminal 330 and the second input terminal 335. The first input terminal 330 can include a positive input terminal of the inverter 300 and the second input terminal 335 can include a negative input terminal of the inverter 300. The first input terminal 330 can be spaced a predetermined distance from the second input terminal 335 along the first surface 310 or along the second edge surface 320 of the capacitor housing. The predetermined distance can vary and can provide spatial separation between cells such that creepage or clearance (creepage-clearance) requirements are met or exceeded. Creepage can refer to a separation (e.g., shortest distance) between connection or weld points between conductors, such as the first input terminal 330 and the second input terminal 335 as measured along the first surface 310 or the second edge surface 320 of the capacitor housing 305. For example, the predetermined distance can be selected to prevent arcing between the conductors. The predetermined distance between the first input terminal 330 and the second input terminal 335 can be in a range from 8 mm to 12 mm (e.g., 10 mm) air distance minimum between exposed conductors of different voltages.

The first and second input terminals 330, 335 can include conductive material, such as but not limited to copper. The first and second input terminals 330, 335 can be formed in a variety of different shapes to accommodate coupling with transistor lead frames or coupling with other inverters 300 within a drive train unit of an electrical vehicle. The first and second input terminals 330, 335 can have a straight shape, or a curved or bent shape to accommodate coupling over portions of the first surface 310 or edge surfaces 315, 320 of the capacitor housing 305 (see also terminals 820, 825 of FIG. 8). As depicted in FIG. 3, each of the first and second input terminals 330, 335 can include a first portion 380 that is parallel with the first surface 310 and a second portion 385 that is perpendicular with respect to the first surface 310 and parallel with the edge surface 315. For example, the first and second input terminals 330, 335 can have a "U" shape. The first input terminal 330 can couple with a positive bus-bar (not shown) to receive a positive voltage and provide the positive voltage to the inverter 300. The second input terminal 335 can couple with a negative bus-bar (not shown) to receive a negative voltage and provide the negative voltage to the inverter 300.

The transistors 120 are coupled with, disposed on or connected to the first surface 310 of the inverter 300. The transistors 120 can be arranged along the first surface 310 in a predetermined order. For example, and as depicted in FIG. 3, a first plurality of transistors 120 can be aligned along the first side surface 340 such that their respective leads 205 extend out away from the inverter 300. The leads 205 can be arranged, positioned or organized for coupling with the lead frame of the capacitor 115.

The first leads 205 can extend out at a variety of different angles with respect to the first surface 310 or the first side surface 340. For example, the first leads 205 can extend out straight and parallel with respect to the first surface 310 and perpendicular with respect to the first side surface 340. The first leads 205 can have varying lengths and the particular length of the first leads 205 can be selected based in part on a distance to an electrical component to couple with, such as but not limited to a printed circuit board.

The second plurality of transistors 120 can be aligned along the second side, different surface 345 such that their respective leads 205 extend out away from the inverter 300. The second leads 205 can extend out at a variety of different angles with respect to the first surface 310 or the second side surface 345. For example, the second leads 205 can extend out straight and parallel with respect to the first surface 310 and perpendicular with respect to the second side surface 345. The second leads 205 can have varying lengths and the particular length of the second leads 205 can be selected based in part on a distance to an electrical component to couple with, such as but not limited to a printed circuit board.

The transistors 120 and leads 205 can be arranged along the first surface 310 in a variety of different arrangements and a particular arrangement can be selected based at least in part on an application of the inverter 300. For example, the first plurality of transistors 120 can be arranged in a first row along the first side surface 340 and the second plurality of transistors 120 can be arranged in a second row along the second side surface 345. The first row of transistors 120 can be spaced from the second row of transistors 120 a distance selected based in part on the dimensions of the first surface 310. Each of the rows of transistors 120 may include the same number of transistors or the rows of transistors 120 may include a different number of transistors 120. The transistors 120 in the same row can be positioned such that one or more side edges are in contact a side edge of a single transistor 120 or two transistors 120 of the same row (e.g., one transistor 120 on each side). Thus, the transistors 120 can be arranged in a uniformed row along the respective side surfaces 340, 345. The first plurality of transistors 120 can be spaced from the second plurality of transistors 120 along the first surface 310. For example, the first plurality of transistors 120 can be evenly spaced or symmetrically from the second plurality of transistors 120 along the first surface 310. For example, each of the transistors 120 in the first plurality of transistors 120 can be spaced the same distance from a corresponding transistor 120 of the second plurality of transistors 120. The first plurality of transistors 120 can be asymmetrically spaced from the second plurality of transistors 120 along the first surface 310. For example, one or more of the transistors 120 in the first plurality of transistors 120 can be spaced different distances from corresponding transistors 120 of the second plurality of transistors 120. The one or more of the transistors 120 in the first plurality of transistors 120 can be spaced with respect to each other with a pitch (e.g., center to center spacing) in a range from 15 mm to 20 mm (e.g., 17.5 mm). The one or more of the transistors 120 in the second plurality of transistors 120 can be spaced with respect to each other with a pitch (e.g., center to center spacing) in a range from 15 mm to 20 mm (e.g., 17.5 mm). The one or more of the transistors 120 in the first plurality of transistors 120 can be spaced with respect to the one or more transistors 120 in the second plurality of transistors 120 in a range from 10 mm to 20 mm (e.g., 14 mm).

The first surface 310 can correspond to a lead frame of the capacitor 115. Therefore, the transistors 120 can be coupled (e.g., electrically coupled, directly and electrically coupled) with the lead frame of the capacitor 115 through the inverter 300 to form the half bridge inverter circuit 100. For example, the first input terminal 330 can correspond to a first input terminal (e.g., positive input terminal) for the half-bridge inverter circuit 100. The second input terminal 335 (e.g., negative input terminal) can correspond to an input terminal for the half-bridge inverter circuit 100. The phase terminal 325 can correspond to an output terminal for the half-bridge inverter circuit 100. The transistors 120 and the capacitor 115 can electrically couple with the first input terminal 330, the second input terminal 335, and the output terminal 325 to form the half-bridge inverter circuit 100. The first plurality of transistors 120 can couple with the first input terminal 330 and the output terminal 325 and the second plurality of transistors 120 can couple with the second input terminal 335 and the output terminal 325. The transistors 120 being coupled with the lead frame of the capacitor 115 can reduce the size of the inductance loop formed by the half bridge inverter circuit 100 of FIG. 1. The couplings as described herein can include, but not limited to, electrical couplings, physical couplings, direct couplings, or couplings with one or more intervening elements between the coupled elements. For example, the transistors 120 can be electrically coupled with the lead frame of the capacitor 115 to transmit, provide, or receive a voltage signal, a current signal, an electrical signal or other forms of signals between two elements.

Figure 4:
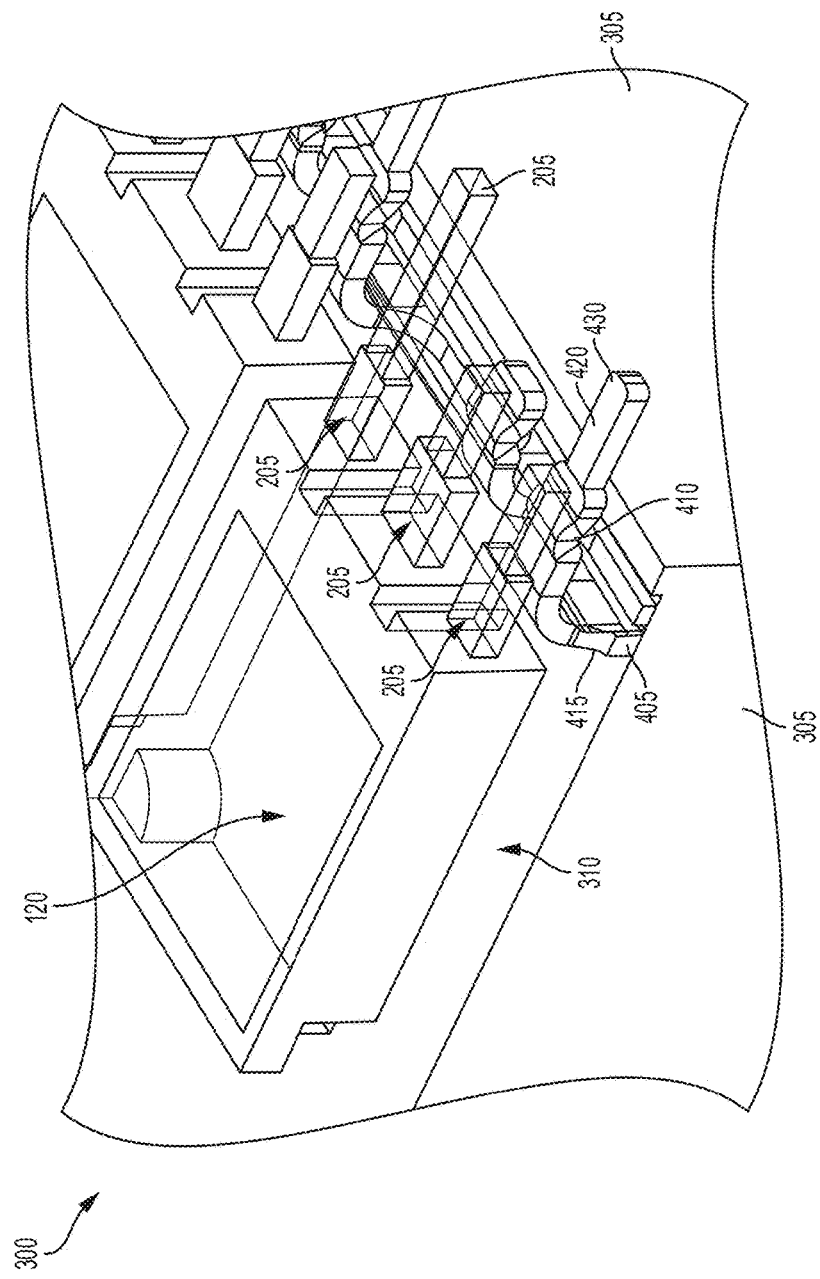
FIG. 4 depicts example diagram illustrating connections between transistors and transistor lead frames on a surface on an inverter, according to an illustrative implementation.

FIG. 4 depicts an example view of a first transistor 120 of the plurality of transistors 120 coupled with or disposed on the first surface 310 of the inverter 300. The leads 205 of the first transistor 120 are coupled with connection points 410 (e.g., hump portion) of the capacitor leads 430 of a capacitor lead frame 405. The transistors 120 can include a gate terminal (or lead), collector terminal (or lead), and a emitter terminal (or lead). The gate terminal can correspond to a control terminal and be used to control the respective transistor 120 switching. The collector terminal and the emitter terminal can carry current to and from the respective transistor 120.

The transistors leads 205 can be resistive welded with the connection point 410 of the capacitor lead frame 405. The transistor leads 205 can be soldered to the connection point 410 of the capacitor lead frame 405. The transistor leads 205 can be welded (e.g., resistive welded, ultrasonic welded) to the connection point 410 of the capacitor lead frame 405. The connection point 410 can have a generally rounded, spherical or hump shape. The connection point 410 can be formed such that it extends up or towards the transistor leads 205. For example, the shape of the connection point 410 can be selected to support coupling the capacitor lead frame 405 with one or more leads 205 of one or more transistors 120.

The capacitor lead frame 405 can include capacitor leads 430 that extend out of at least one surface of the inverter 300 to couple with one or more transistors 120. The capacitor leads 430 can include one or more portions 415, 420 that extend out of the first surface 310 of the inverter 300 at predetermined angles or a combination of predetermined angles. For example, the capacitor leads 430 can include a first portion 415 that extends out such that it is perpendicular (e.g., 45 degrees) to the first surface 310 and can include a second portion 420 that extends out such that the second portion 420 is parallel with the first surface 310. The particular shape or angle that the portions 415, 420 of the capacitor leads 430 extend out of the different surfaces (e.g., first surface 310, edge surfaces 340, 345) of the inverter 300 can vary and can be selected based at least in part on the dimensions of the components of the inverter 300 or a particular application of the inverter 300. The capacitor leads 430 can be formed having a straight shape, curved shape, or angled shape. For example, the capacitor leads 430 can be formed such that they are angled in a range from 20 degrees to 70 degrees (e.g., 45 degrees) with respect to the first surface. The capacitor lead frame 405, the capacitor leads 430, portions 415, 420, and connection point 410 can include conductive material, such as but not limited to copper. The capacitor lead frame 405 can have a length in a range from 150 mm to 170 mm (e.g., 164 mm). For example, the capacitor lead frame 405 can include or be formed as a continuous copper piece that spans or has the same length as inverter module 300. The capacitor leads 430 can have a width in a range from 1 mm to 3 mm (e.g., 2 mm). The capacitor leads 430 can have a length in a range from 9 mm to 16 mm.

Figure 5:
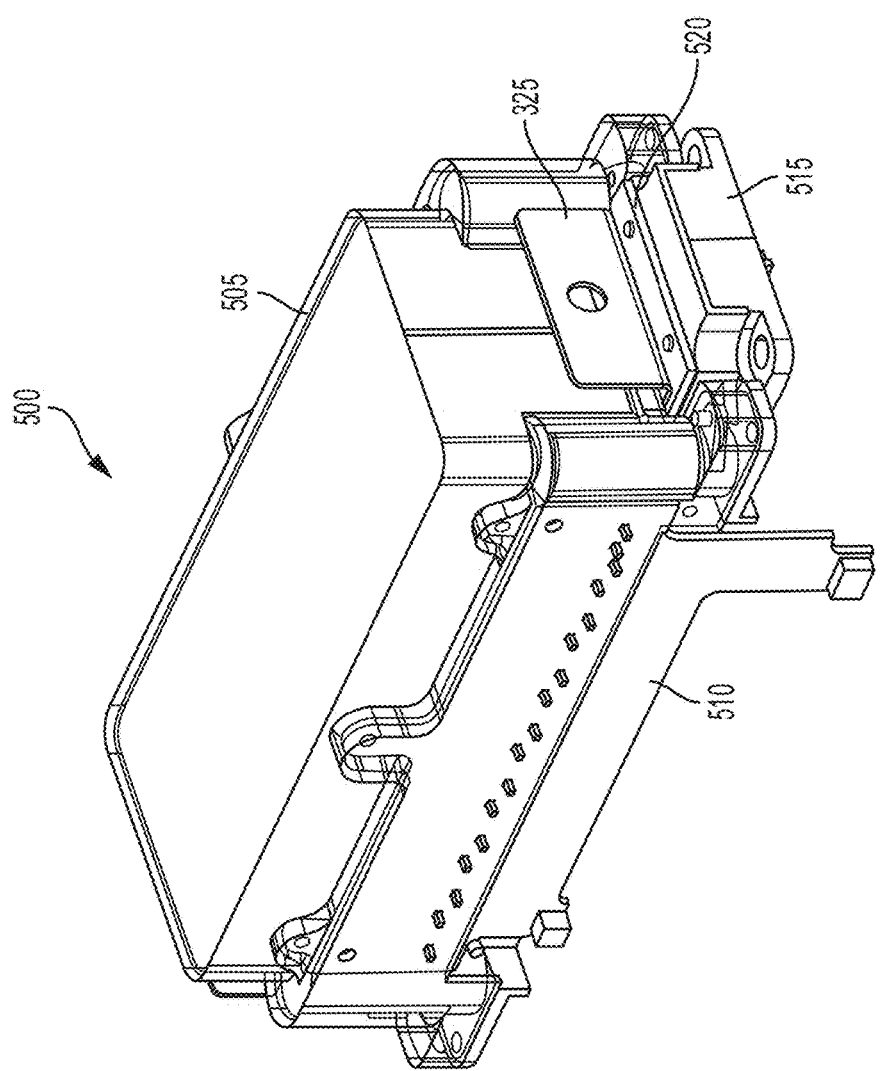
FIG. 5 depicts an example diagram of a power stage assembly having a capacitor, printed circuit board, cold plate, thermal pad, and an output terminal, according to an illustrative implementation.

FIG. 5 depicts an example power stage assembly 500. The power stage assembly can include at least one gel tray 505 (e.g., potting compound container), at least one printed circuit board (PCB) 510, at least one output terminal 325, at least one cold plate 515 and at least one thermal pad 520. The power stage assembly 500 can house the inverter 300 and the half-bridge inverter circuit 100.

The output terminal 325 can be coupled with, disposed over or in contact with at least one surface of the thermal pad 520. The thermal pad 520 can provide active cooling to the output terminal 325. For example, thermal pads 520 can be disposed at opposing ends of the power stage assembly 500 and each of the thermal pads 520 can be disposed between a portion of the cold plate 515 and a portion of the capacitor 115 (not directly shown in FIG. 5 within the power stage assembly 500). The thermal pads 520 can operate as a thermal interface between the electronics of the power stage assembly 500. For example, the thermal pads 520 can provide active cooling for inputs and outputs (e.g., output terminal 325) of the power stage assembly 500. The thermal pads 520 and the cold plate 515 can provide active cooling to the three major conductors (e.g., positive terminal 105, negative terminal 110, phase terminal 130) in the power stage assembly 500. Depending on the specifications, dimensions (e.g., thickness) and temperature gradients within the capacitor 115, the thermal pads 520 and cold plate 515 can provide heat rejection of in a range from 50 watts to 100 watts for a single power stage assembly 500. The thermal pads 520 can include non-conductive material, plastic material, aluminum oxide, aluminum nitride, silicon material or a silicon aluminum blend material, for example.

The cold plate 515 can include a plurality of cooling passages in which coolant can be pumped or otherwise provided through. For example, the cold plate 515 can include a plurality of cooling passages that coolant fluid can be provided to and flow through to cool electronics (e.g., transistors 120, capacitors 115) or other components of the power stage assembly 500. The geometry of the cold plate 515 can be selected and formed to enhance heat transfer between the material of the cold plate 515 (e.g., aluminum) and the fluid flowing through the cooling passages. The cold plate 515 can include aluminum or an aluminum heat sink. The cold plate 515 can include one or more different layers or one or more different materials. The different layers of the cold plate 515 can be formed into a single layer during manufacture, such as by friction stir weld construction.

One or more PCB 510 can couple with one or more surfaces of the power stage assembly 500. For example, a first PCB 510 can couple with a side surface 340 of the inverter 300 coupled with the gel tray 505. The PCB 510 can include control electronics to communicate or control the components of the power stage assembly 500, such as but not limited to transistors 120 (e.g., to turn one or more transistors 120 on or off, open or close the transistor switches).

The PCB 510 can be oriented with respect to different components of the power stage assembly 500 to reduce a conductor length between the PCB 510 and the components of the PCB 510. For example, the PCB 510 can be oriented vertically with respect to the capacitor 115 to provide reduced or minimal conductor length between the transistors 120 and control circuitry of the PCB 510.

The gel tray 505 can include poly carbon material, or other forms of high temperature plastic. The gel tray 505 can be formed using various injection molded techniques. The gel tray 505 can be disposed over one or more components of the power stage assembly 500 and can operate as an insulator for the components (e.g., electronics) of the power stage assembly 500.

The power stage assembly 500 can be referred to herein as a power module, half bridge module or a half bridge inverter module. The power stage assembly 500 can couple with one or more other power stage assemblies 500 to form a multiple phase inverter system. For example, a multiple phase inverter module formed having three power stage assemblies 500 arranged in a triplet configuration for electric vehicle. The multiple phase inverter module can couple with a drive unit of an electric vehicle and can provide three phase voltages to the drive unit. For example, each of the power stage assemblies 500 can generate a single phase voltage and thus, the three power stage assemblies 500 arranged in a triplet configuration can provide three phase voltages. The power stage assemblies 500 can have a length in a range from 220 mm to 230 mm (e.g., 224 mm). The power stage assemblies 500 can have a width in a range from 80 mm to 90 mm (e.g., 87 mm). The power stage assemblies 500 can have a height in a range from 60 mm to 72 mm (e.g., 67.5 mm).

Figure 6:
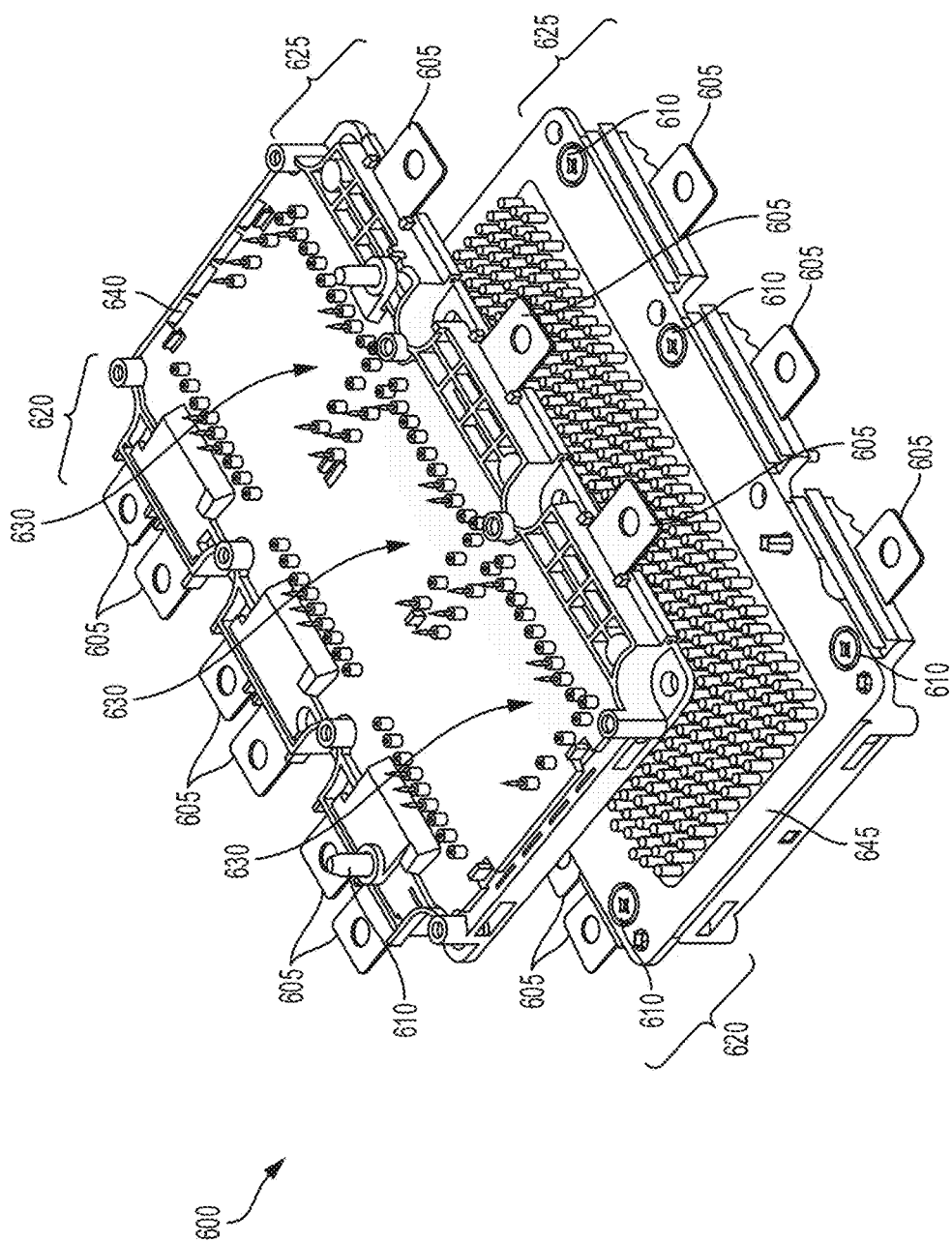
FIG. 6 depicts an example diagram of a transistor module having bolted lead frame terminals, according to an illustrative implementation.

FIG. 6 depicts an example transistor module 600 that can include bolted lead frame terminals 605. For example, the transistor module 600 can include a first surface 640 (e.g., top surface) of a first transistor module 600 and a second surface 645 (e.g., internal surface, inner surface coolant, heat-transfer surface (e.g., may contain extended surface geometry for pin fin array)) of a second transistor module 600. The first surface 640 can form an outer shell or outer surface and protect or shield circuity within the transistor module 600 from an environment around the transistor module 600. The second surface 645 can house or hold circuitry within the transistor module 600, such as but not limited to PCBs, leads, semiconductor devices, wirebonds, or bus-bars. The transistor module 600 can include electrically nonconductive material, such as but not limited to non-conductive material, plastic material, aluminum oxide, aluminum nitride.

The transistor module 600 can include multiple portions 630, with each portion 630 having one or more lead frame terminals 605 extending from a first side 620 (e.g., edge side, edge surface) and one more lead frame terminals 605 extending from a second, different side 625 (e.g., edge side, edge surface) of the transistor module 600. For example, the first transistor module 600 can include a first portion 630, a second portion 630, and a third portion 630. The first portion 630 can include two lead frame terminals 605 extending from the first side 620 and one lead frame terminal 605 extending from the second side 625. The second portion 630 can include two lead frame terminals 605 extending from the first side 620 and one lead frame terminal 605 extending from the second side 625. The third portion 630 can include two lead frame terminals 605 extending from the first side 620 and one lead frame terminal 605 extending from the second side 625.

The second transistor module 600 can include a first portion 630, a second portion 630, and a third portion 630. The first portion 630 can include two lead frame terminals 605 extending from the first side 620 and one lead frame terminal 605 extending from the second side 625. The second portion 630 can include two lead frame terminals 605 extending from the first side 620 and one lead frame terminal 605 extending from the second side 625. The third portion 630 can include two lead frame terminals 605 extending from the first side 620 and one lead frame terminal 605 extending from the second side 625. The number of portions 630 or number of transistor lead frames for each portion 630 can vary and be selected based at least in part on a particular application of the transistor module 600.

The lead frame terminals 605 can couple with the transistor module 600 using bolted connections 610. The bolted connections 610 can couple with threaded portion (e.g., round threaded surface configured to receive various connectors) of the transistor module 600 to secure the lead frame terminals 605 to the transistor module 600. The bolted connections 610 can include a threaded outer portion (e.g., round threaded surface) to couple with the threaded portion of the transistor module 600. The bolted connections 610 can include fasteners of different sizes and dimensions. The bolted connections may include screws, bolts, or fasteners. The lead frame terminals 605 can include conductive material, such as but not limited to copper. The lead frame terminals 605 can couple with semiconductor devices within the transistor module 600 through one or more wirebonds. The lead frame terminals 605 can couple with external bus-bars (e.g., separate from the transistor module 600) through one or more bolted connections.

Figure 7:
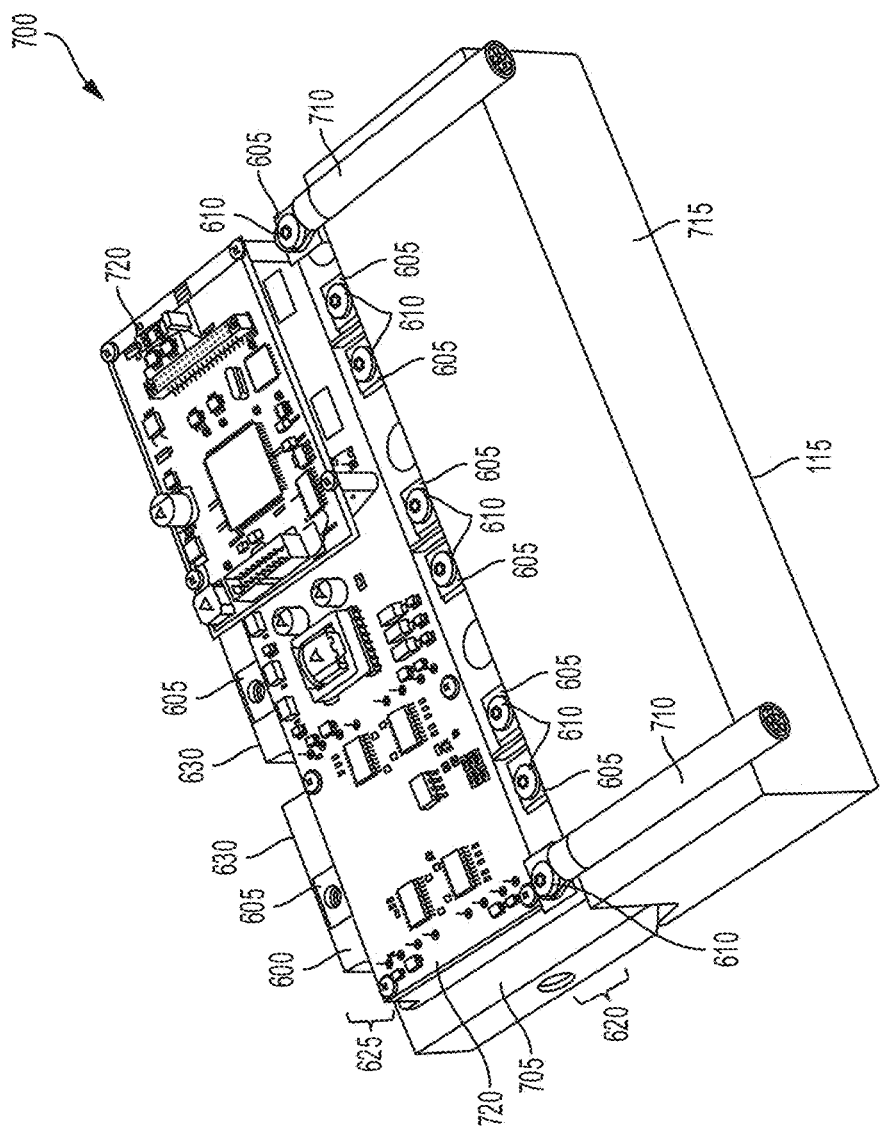
FIG. 7 depicts an example diagram of a power converter component having a transistor module coupled with a capacitor, according to an illustrative implementation.

FIG. 7 depicts an example power converter component 700 having the transistor module 600 coupled with a first surface 705 of a capacitor 115. The capacitor 115 can include at least one capacitor housing 715 that can be formed such that it is disposed about, surrounds or houses the capacitor 115 and transistor module 600. The transistor module 600 can include multiple portions 630, with the first side 620 of each portion 630 having two lead frame terminals 605 and the second side 625 having one lead frame terminal 605. The lead frame terminals 605 can couple with the first surface 705 of the capacitor 115 using, for example, bolted connections 610. The bolted connections 610 can secure the lead frame terminals 605 to the capacitor 115. For example, the bolted connections 610 can hold the lead frame terminals 605 in place such that an electrical coupling between the lead frame terminals 605 and the capacitor 115 can be established.

The capacitor 115 can include at least one DC distribution bar 710. For example, the capacitor 115 can include a first DC distribution bar 710 coupled with the capacitor housing 715 and a second DC distribution bar 710 coupled with the capacitor housing 715. The DC distribution bus-bar can be internal DC distribution bus-bars. The DC distribution bars 710 can carry DC current, for example, from a battery to the inverter assembly 700. The DC distribution bars 710 can be embedded within the capacitor housing 715 (e.g., capacitor case). The DC distribution bars 710 can distribute DC current to different groups of semiconductor devices through the lead frame terminals 605 (e.g., through six lead frame terminals 605 which form the three phases.

One or more circuit boards 720 (e.g., printed circuit boards) can be coupled with, disposed on or electrically coupled with the transistor module 600 and the capacitor 115. The circuit boards 720 can include control circuitry or communication circuitry to generate signals for the transistor module 600 or capacitor 115, transmit signals to the transistor module 600 or capacitor 115 or receive signals from the transistor module 600 or capacitor 115. The signals may include control signals or power signals. The controls signals can be used to activate or de-active the transistor module 600 or the capacitor 115. The power signals can provide power to the transistor module 600 or the capacitor 115.

Figure 8:
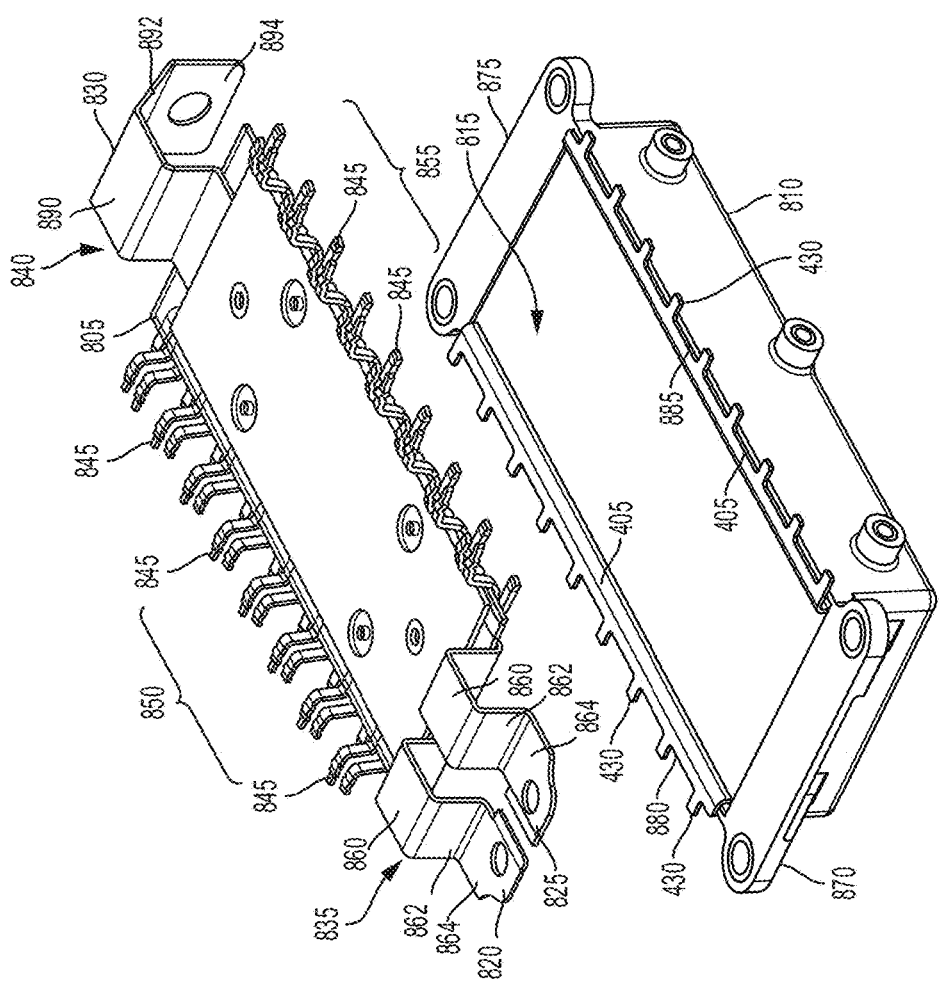
FIG. 8 depicts an example diagram of a laminated bus-bar and a capacitor, according to an illustrative implementation.

FIG. 8 depicts an example view of a laminated bus-bar 805 disposed above a first surface 815 (e.g., top surface) of a capacitor 810. The laminated bus-bar 805 includes two input terminals 820, 825 (e.g., positive input terminal and negative input terminal) disposed at a first side 835 and an output terminal 830 disposed at a second, different side 840. The second side 840 can be an opposite or opposing from the first side 835 of the laminated bus-bar 805.

The first and second input terminals 820, 825 can include conductive material, such as but not limited to copper. The first and second input terminals 820, 825 can be formed in a variety of different shapes to accommodate coupling with a first surface 815 of the capacitor 810. The first and second input terminals 820, 825 can have or include a straight shape, or a curved or bent shape to accommodate coupling over portions of the first surface 815. The first and second input terminals 820, 825 can include a first portion 860 that is parallel with the first surface 815, a second portion 862 that is perpendicular with respect to the first surface 815, and a third portion 864 that is parallel with respect to the first surface 815. The first input terminal 820 can couple with a positive bus-bar (not shown in FIG. 8) to receive a positive voltage and provide the positive voltage to an inverter. The second input terminal 825 can couple with a negative bus-bar (not shown) to receive a negative voltage and provide the negative voltage to the inverter.

The output terminal 830 can include conductive material, such as but not limited to copper. The output terminal 830 can be formed in a variety of different shapes to accommodate coupling with a first surface 815 of the capacitor 810. The output terminal 830 can be formed having a straight shape, or a curved or bent shape to accommodate coupling over portions of the first surface 815. For example, the output terminal 830 can include a first portion 890 that is parallel with the first surface 815, a second portion 892 that is formed at an angle (e.g., angle ranging from 10 degrees to 60 degrees) relative to the first surface 815, and a third portion 894 that is perpendicular with respect to the first surface 815. The output terminal 830 can couple with a phase bus-bar (not shown in FIG. 8) to provide power generated by an inverter to other electrical components of an electric vehicle.

The laminated bus-bar 805 can include a plurality of leads 845 extending from a third side 850 and a second plurality of leads 845 extending from a fourth, different side 855. The fourth side 855 can be an opposite or opposing side with respect to the third side 850 of the laminated bus-bar 805. Each of the first side 835, second side 840, third side 850 and fourth side 855 can correspond to different side portions or edges of the laminated bus-bar 805.

The capacitor 810 can include a first side 870, a second side 875, a third side 880, and a fourth side 885. The second side 875 can be an opposite or opposing side with respect to the first side 870 and the fourth side 885 can be an opposite or opposing side with respect to the third side 880 of the capacitor 810. Each of the first side 870, second side 875, third side 880, and fourth side 885 can correspond to different side portions or edges of the capacitor 810. The first side 870, second side 875, third side 880, and fourth side 885 can collectively form the footprint or borders of the capacitor 810. The length, height or width of each of the first side 870, second side 875, third side 880, and fourth side 885 can vary. The dimensions of the first side 870, second side 875, third side 880, and fourth side 885 can be selected based at least in part on the desired dimensions of a capacitor 810.

The capacitor 810 can include a capacitor lead frame 405 having capacitor leads 430 extending from the third side 880 and capacitor leads 430 extending from the fourth side 885. The capacitor leads 430 can couple with the leads 845 of the laminated bus-bar 805.

Figure 9:
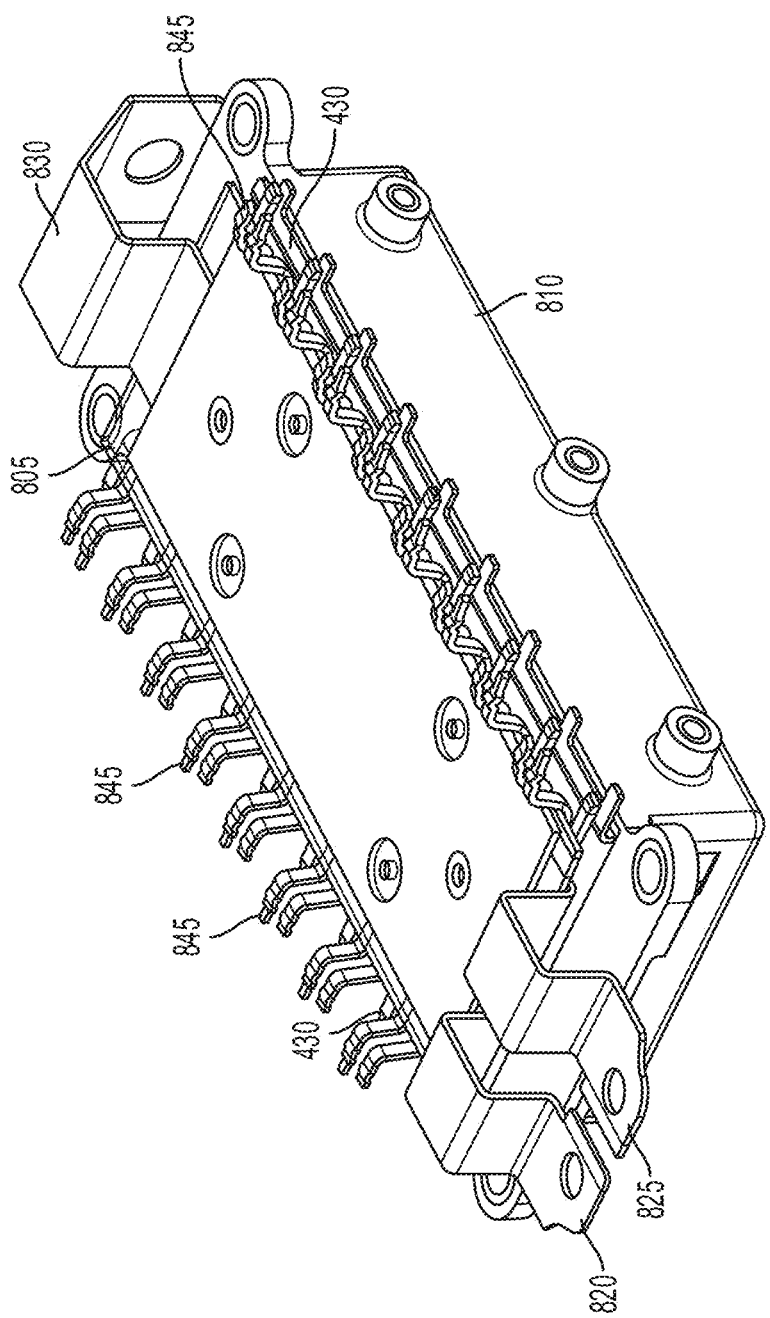
FIG. 9 depicts an example diagram of a laminated bus-bar coupled with a capacitor, according to an illustrative implementation.

For example, FIG. 9 depicts an example of the laminated bus-bar 805 coupled with the first surface 815 of the capacitor 810. The leads 845 can be coupled with or contact with the capacitor leads 430 along the third sides and fourth sides of both the laminated bus-bar 805 and the capacitor 810. Thus, the leads 845 of the laminated bus-bar 805 can coupled with or contact with the capacitor lead frame 405 of the capacitor 810. The leads 845 of the laminated bus-bar 805 can be electrically coupled with the capacitor lead frame 405 of the capacitor 810 to transmit electrical signals to the capacitor 810 or to receive electrical signals from the capacitor 810.

Figure 10:
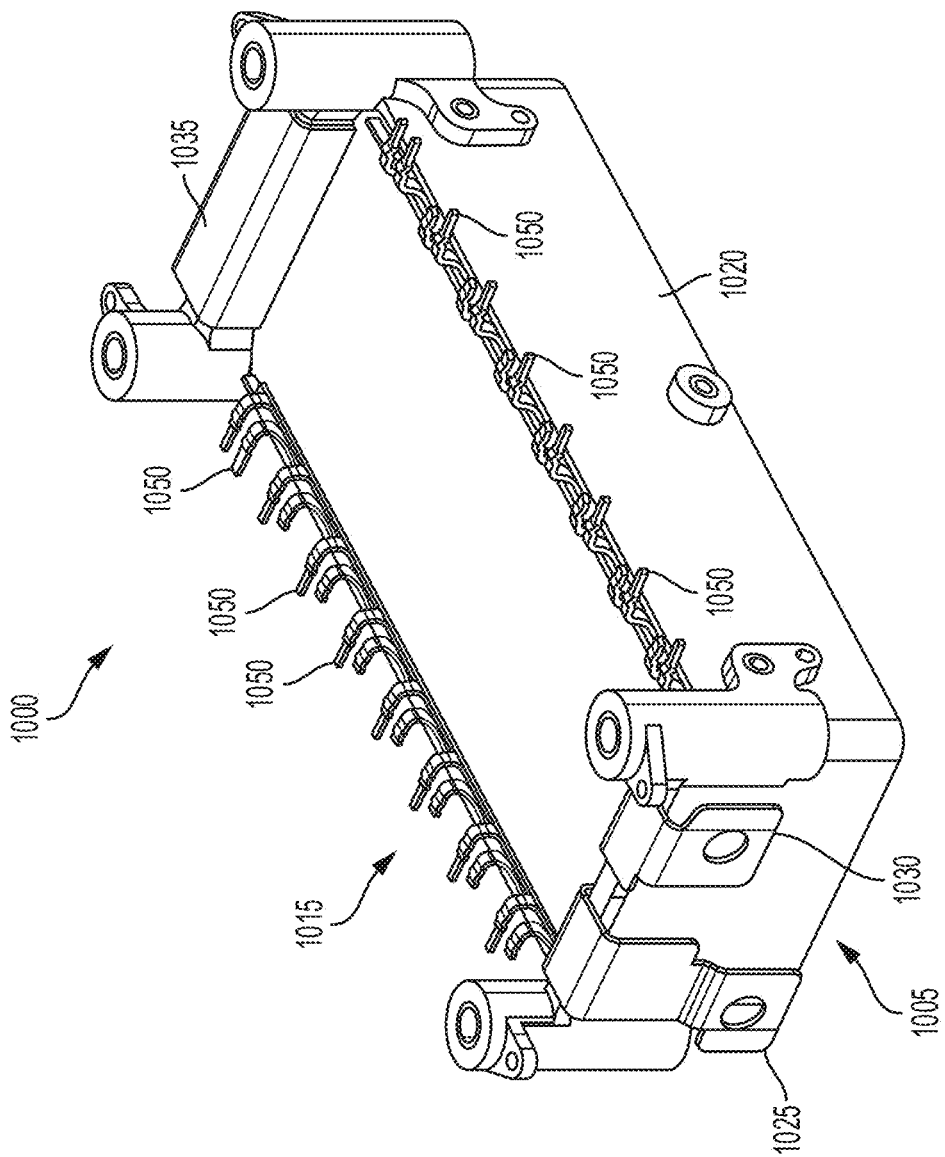
FIG. 10 depicts an example diagram of a capacitor having a positive input terminal and a negative input terminal, according to an illustrative implementation.

FIG. 10 depicts an example capacitor 1000 having a first side 1005 with a first input terminal 1025 and a second input terminal 1030 disposed. The first input terminal 1025 can be a positive input terminal and the second input terminal 1030 can be a negative input terminal, or the first input terminal 1025 can be a negative input terminal and the second input terminal 1030 can be a positive terminal. The first input terminal 1025 can be disposed at a different height or level with respect to the second input terminal 1030 along the first side 1005 of the capacitor 1000. The first input terminal 1025 can be disposed at a different height from the second input terminal 1030 to provide spacing to couple with different bus-bars along the first side 1005 of the capacitor 1000. For example, the first input terminal 1025 can couple with a first bus-bar disposed at a first height along the first side 1005. The second input terminal 1030 can couple with a second bus-bar as a second, different height along the first side 1005. Thus, the bus-bars can be disposed along the same first side 1005 as they are disposed at different heights.

The capacitor 1000 can include a second side 1010 having an output terminal 1035. A third side 1015 and a fourth side 1020 of the capacitor 1000 can include a first plurality of leads 1050 and a second plurality of leads 1050, respectively. The leads 1050 can be positioned such that they extend from the third side 1015 at a predetermined angle (e.g., perpendicular) and extend from the fourth side 1020 at a predetermined angle (e.g., perpendicular). The leads 1050 can be integrally formed with the capacitor 1000. For example, capacitor 1000 may not include a laminated bus-bar (e.g., laminated bus-bar 805) or intermediate bus-bar that is a separate component from the capacitor 1000.

The second side 1010 can be an opposite or opposing side with respect to the first side 1005 and the fourth side 1020 can be an opposite or opposing side with respect to the third side 1015 of the capacitor 1000. Each of the first side 1005, second side 1010, third side 1015, and fourth side 1020 can correspond to different side portions or edges of the capacitor 1000.

Figure 11:
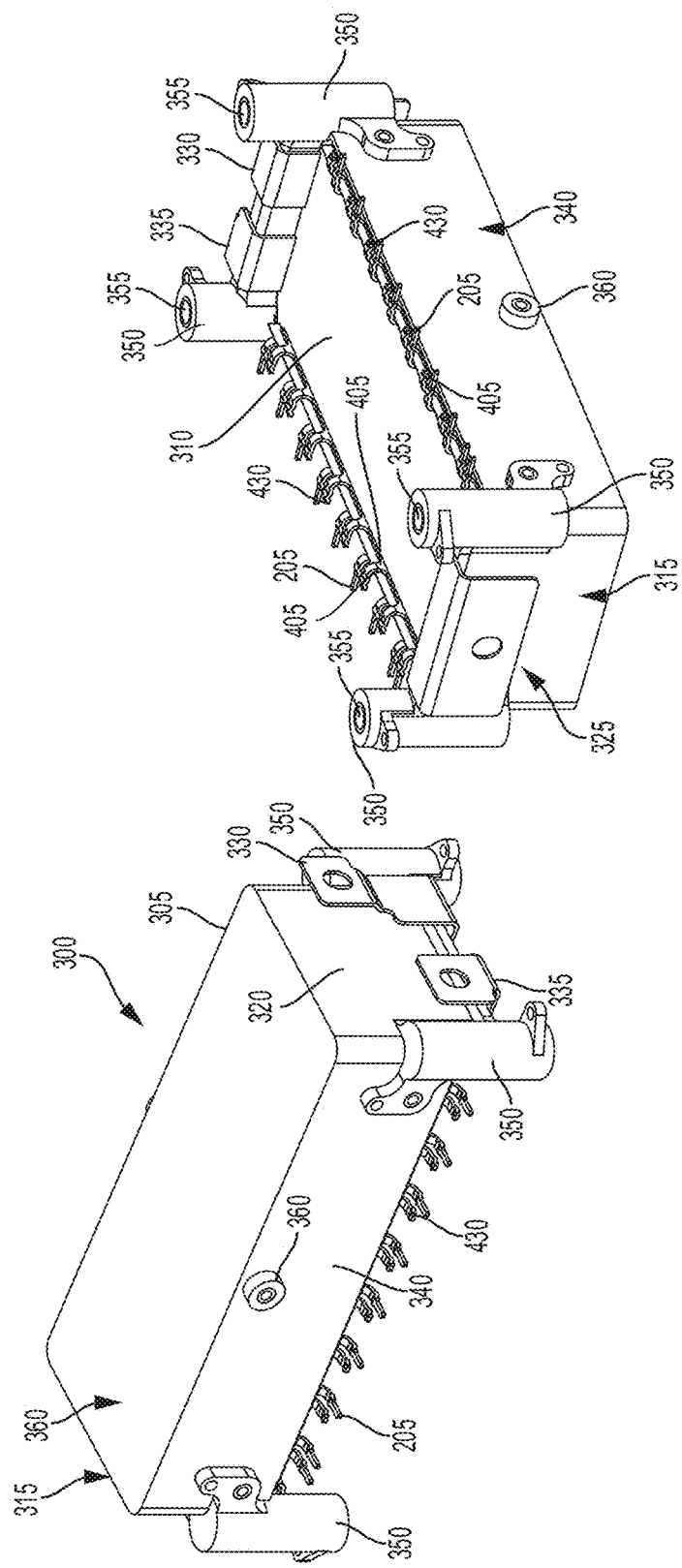
FIG. 11 depicts an example diagram of an inverter housing, according to an illustrative implementation.

FIG. 11 depicts an example inverter 300 that includes a housing 305 having a first surface 310 (e.g., top surface, bottom surface), a second surface 360 (e.g., bottom surface, top surface), one or more side surfaces 340, a first edge surface 315 and a second edge surface 320. The first surface 310, the second surface 360, the side surfaces 340, and edge surfaces 315, 320 can be formed as one integral element. The first surface 310, the second surface 360, the side surfaces 340, and edge surfaces 315, 320 can be formed as individual elements and coupled together. The inverter 300 can operate as a single phase capacitor package of a multiple phase inverter module (e.g., power module) for an electric vehicle. For example, a multiple phase inverter module can include three capacitor packages 300 to form a three phase inverter module for a drive unit of an electric vehicle.

The first edge surface 315 can include a phase terminal 325. The phase terminal 325 can be or include at least one output terminal of the inverter 300. The second edge surface 320 can include a first input terminal 330 and a second input terminal 335. The first input terminal 330 can include a positive input terminal of the inverter 300 and the second input terminal 335 can include a negative input terminal of the inverter 300.

The inverter 300 includes a capacitor lead frame 405 having capacitor leads 430 extending at a predetermined angle from the capacitor housing 305. The predetermined angle can vary and can be selected based at least in part on an angle of the transistor leads 205 extend from the capacitor housing 305. For example, the capacitor leads 430 can extend out straight such that the capacitor leads are parallel with respect to the first surface 310. The capacitor leads 430 can extend at an angle from 0 degrees to 70 degrees with respect to the first surface 310. The capacitor leads 430 can be positioned or arranged such that they are aligned with the transistor leads 205 to allow for the capacitor leads 430 to be coupled with the transistor leads 205.

The plurality of transistor leads 205 can be arranged or positioned such that they extend at a predetermined angle (e.g., substantially perpendicular) from a side surface 340 of the inverter 300. For example, a first plurality of transistor leads 205 can be arranged or positioned such that they extend at a predetermined angle (e.g., substantially perpendicular) from a first side surface 340 and a second plurality of transistor leads 205 can be arranged or positioned such that they extend at a predetermined angle (e.g., substantially perpendicular) from a second, different side surface 340 of the inverter 300.

The inverter 300 includes a plurality of mounting feet 350. The mounting feet 350 can couple with mounting holes or other forms of connection points of other components of an inverter module. For example, the mounting feet 350 can couple with side surfaces 340 of the capacitor housing 305. The mounting feet 350 can also couple with corner portions of the capacitor housing 305. The mounting feet 350 can extend from at least one surface of the capacitor housing 305. For example, the mounting feet 350 can extend from the first surface 310 to couple with mounting holes or other forms of connection points of other components of an inverter module, such as but not limited to a inverter module housing or base portion.

The mounting feet 350 can include at least one mounting hole 355. The mounting holes 355 can receive or engage mounting feet of other components of an inverter module or other connection points. The mounting holes 355 can include threaded holes or non-threaded holes. The mounting holes 355 can have a round shape, spherical shape, or rectangular shape. The mounting feet 350 can have a variety of different shapes, sizes or dimensions. The mounting feet 350 can have a round shape, spherical shape, or rectangular shape. The mounting feet 350 can have a variety of different shapes, sizes or dimensions. The inverter 300 can include an inlet 360. Then inlet 360 can receive fluid. The inverter 300 can include an outlet.

FIGS. 12-17 depict various views of the capacitor leads 430 of the capacitor lead frame 405. The capacitor leads 430 can extend out at one or more different angles with respect to the first surface 310 of the capacitor package. The capacitor leads 430 can be arranged or organized in pairs 460 having at least one first lead 430 and at least one second lead 450. The capacitor leads 430 can include a collector lead and an emitter lead. For example, the first lead 430 may correspond to a collector lead and the second lead 450 may correspond to an emitter lead. The first lead 430 may correspond to an emitter lead and the second lead 450 may correspond to a collector lead. Each of the capacitor leads 430 can couple with at least one of the positive terminal 105, the negative terminal 110 or the phase terminal 130.

The number of pairs 460 of capacitor leads 430, 450 can vary and can be selected based at least in part on a number of transistors 120 to be coupled with the capacitor lead frame 405. For example, and as depicted in FIG. 12, the capacitor lead frame 405 can include sixteen pairs of capacitor leads 430, 450 that can couple with sixteen transistors 120.

FIG. 14 depicts example capacitor leads 430, 450 that can include a connection point 410 to support coupling the capacitor lead frame 405 with one or more leads 205 of one or more transistors 120. The connection point 410 can have a rounded, bump, spherical or hump shape. The connection point 410 can be formed or disposed between a first portion 415 and a second portion 420 of the capacitor leads 430, 450. For example, the capacitor leads 430, 450 can include the first portion 415 that extends out at a first angle (e.g., perpendicular) with respect to the first surface 310 of the inverter 300 and the second portion 420 that extends out at a second angle (e.g., parallel) with respect to the first surface 310 of the inverter 300. The connection point 410 can be formed or disposed between the first portion 415 and the second portion 420, for example, at or substantially near a transition point between the first portion 415 and the second portion 420.

FIG. 15 depicts an example connection point 410 that can couple with the transistor leads 205 through various techniques, such as but not limited to, resistive welding. The shape, size or dimensions of the connection point 410 can be selected to provide contact with a portion of at least one transistor lead 205 of a transistor 120. The shape, size or dimensions of the connection point 410 can provide localized heating at the connection point 410 during the resistive welding process and provide for isolate heat at the connection point 410 such the connection point 410 can couple with, welded with or otherwise connected to a portion of at least one transistor lead 205 of a transistor 120.

As depicted in FIG. 17, an insulation layer 1705 can be disposed between first leads 430 and the second leads 450 in each pair of capacitor leads 430, 450. For example, the insulation layer 1705 can couple with or adhere to a surface of the first leads 430, a surface of the second leads 450, a surface of both the first leads 430 and the second leads 450, or disposed between the first leads 430 and the second leads 450 as the they extend out of the first surface 310 of the capacitor package. The insulation layer 1705 can extend from the first surface 310 to and end point of the terminal leads 450 or the capacitor leads 430 to electrically isolate the terminal leads 450 and the capacitor leads 430. The insulation layer 105 can include nonconductive material.

Figure 19:
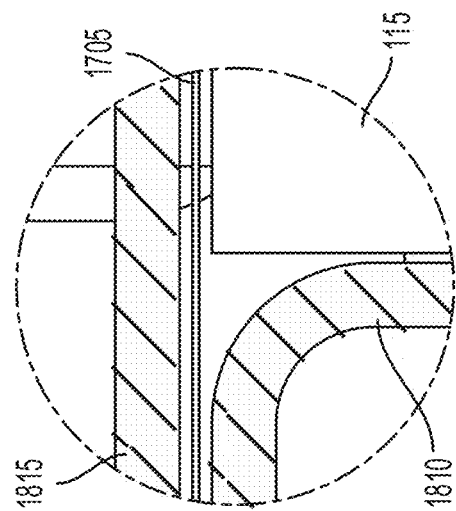
FIGS. 18-19 depict side cross-sectional views of a capacitor lead frame having a positive bus-bar, a negative bus-bar, and a phase bus-bar disposed about a capacitor.
Figure 18:
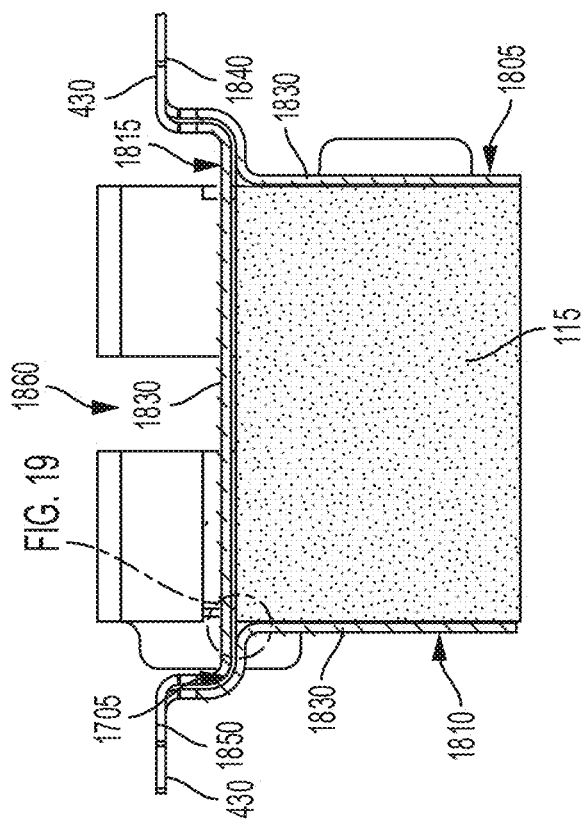

FIGS. 18-19 depict an example capacitor lead frame 405 that can include a positive bus-bar 1805, a negative bus-bar 1810, and a phase bus-bar 1815 disposed about the capacitor 115. The positive bus-bar 1805, negative bus-bar 1810, and phase bus-bar 1815 disposed about the capacitor 115 can form a laminated bus-bar 1860. The capacitor lead frame 405 can correspond to the half bridge inverter circuit 100 of FIG. 1. For example, the positive bus-bar 1805 can correspond to the positive terminal 105, the negative bus-bar 1810 can correspond to the negative terminal 110, and the phase bus-bar 1815 can correspond to the phase terminal 130. The capacitor lead frame 405 can provide a closed inductance loop between the capacitor 115 and transistors 120 coupled with capacitor leads 430, where the capacitor lead frame 405 can make electrical connections directly to the transistors 120 through leads 430.

The capacitor 115 can include a film roll (e.g., cylindrical film roll). The positive bus-bar 1805 can couple with or be disposed such that it is contact with the capacitor 115. For example, the positive bus-bar 1805 can electrically couple with the film roll of the capacitor 115, for example, but not limited to, one or more tab connections. The negative bus-bar 1810 can couple with or be disposed such that it is contact with the capacitor 115. For example, the negative bus-bar 1810 can be electrically coupled with the film roll of the capacitor 115, for example, but not limited to, one or more tab connections.

The capacitor lead frame 405 can include one or more insulation layers 1705 disposed within the capacitor lead frame 405 to electrically isolate different elements or components of the capacitor lead frame 405 from each other. For example, a first insulation layer 1705 can be disposed between the phase bus-bar 1815 and the capacitor 115. The positive bus-bar 1805 can couple with or be in contact with the capacitor 115. A first distance between the phase bus-bar segment 1815 and the capacitor 115 can correspond to a first thickness of the first insulation layer 1705 disposed between the phase bus-bar segment 1815 and the capacitor 115. The negative bus-bar 131 can couple with or be in contact with the capacitor 115. A second insulation layer can be disposed between the positive bus-bar 1805 and the capacitor 115. A second distance between the phase bus-bar segment 1815 and the positive bus-bar segment 1805 can correspond to a second thickness of the second insulation layer 1705 disposed between the phase bus-bar segment 1815 and the positive bus-bar segment 1805. A third insulation layer 1705 can be disposed between the negative bus-bar 1810 and the capacitor 115. A third distance between the phase bus-bar segment 1815 and the negative bus-bar segment 1810 can correspond to a third thickness of the third insulation layer 1705 disposed between the phase bus-bar segment 1815 and the negative bus-bar segment 1810. Insulation layers 1705 can be disposed between the positive bus-bar 1805 and the phase bus-bar 1815 and between the negative bus-bar 1810 and the phase bus-bar 1815.

A gap between the positive bus-bar 1805, the negative bus-bar 1810, the phase bus-bar 1815 and the capacitor 115 can correspond to a thickness or size of the respective insulation layer 1705. The thickness or size of the insulation layer 1705 can vary and can be selected based at least in part on the dimensions of the capacitor lead frame 405 or an application of the capacitor lead frame 405. For example, the thickness or size of the insulation layer 1705 can be 0.25 mm or vary below 0.25 mm or vary above 0.25 mm.

The arrangement of elements of the capacitor lead frame 405 can minimize the size of the inductance loop present in the half-bridge circuit 100. For example, the capacitor 115 and the positive bus-bar, negative bus-bar 1810, and phase bus-bar 1815 can be one homogenous part, sharing structure, insulation, mounting points, and heat dissipation surfaces. The laminated bus-bar assembly as described herein can include a smaller or more compact design and include less components as one or more intermediate bus-bars are not needed to couple the capacitor lead frame 405 with the transistor lead frame, the positive bus-bar, negative bus-bar 1810, or phase bus-bar 1815. For example, the phase bus-bar 1815 (e.g., phase conductor of the half-bridge inverter circuit) can be positioned, arranged or disposed such that it is spaced from a surface of elements of the capacitor 115 (e.g., capacitor bobbin) by a distance corresponding to a thickness of an insulating layer 1705. The arrangement or positioning of elements such as the capacitor 115, transistors 120, and the positive bus-bar, negative bus-bar 1810, or phase bus-bar 1815 minimizes distances between each of them and can maintain an equidistance between the capacitor 115 and the transistors 120 to provide minimal electrical loss and maintain uniform electrical loss across all transistors. The reduced size of the inductance loop can reduce electromagnetic interference (EMI) noise within the power converter component. Thus, the capacitor lead frame 405 may not include a laminated bus-bar or intermediate bus-bar and a mechanical tolerance stack-up between the capacitor 115 and the laminated bus-bar (or intermediate bus-bar) can be eliminated. The capacitor 405 lead frame 405 can also provide a weight reduction. For example, approximately 30% less copper can be used when the capacitor 115 and the positive bus-bar 1805, the negative bus-bar 1810, and the phase bus-bar 1815 are combined or otherwise coupled with each other to form the capacitor lead frame 405. One or more epoxy layers 1830 can be disposed over or in contact with surfaces of the positive bus-bar 1805, negative bus-bar 1810, and phase bus-bar 1815. For example, the power converter components as described herein can be formed without using one or more intermediate bus-bars, providing the weight reduction. The power converter components as described herein can be formed or manufactured using less material (e.g., less copper, 30% less copper, less fasteners, less insulation layers) as the capacitor lead frame 405 can be coupled directly the transistor lead frames, the positive bus-bar 1805, the negative bus-bar 1810, or the phase bus-bar 1815. Each of the positive bus-bar 1805, the negative bus-bar 1810, and the phase bus-bar 1815 can have a width in a range from 0.5 mm to 3 mm (e.g., 1 mm). Each of the positive bus-bar 1805, the negative bus-bar 1810, and the phase bus-bar 1815 can have a height (or thickness) in a range from 150 mm to 170 mm (e.g., 160 mm). Each of the positive bus-bar 1805, the negative bus-bar 1810, and the phase bus-bar 1815 can have a width in a range from 60 mm to 80 mm (e.g., 70 mm).

The capacitor lead frame 405 can include capacitor leads 430 can extend out from the capacitor lead frame 405 and can couple with (e.g., directly coupled with, electrically coupled with) with lead frames or leads of the plurality of transistors 120. For example, the capacitor lead frame 405 can couple with (e.g., directly couple with, electrically couple with) at least two transistors 120. The capacitor lead frame 405 can include a first lead 1840 that couples with a first transistor 120. The capacitor lead frame 405 can include a second lead 1850 that couples with a second, different transistor. The second portion of the phase bus-bar 1815 can be different from the first portion of the phase bus-bar 1815. An insulation layer 1705 can be disposed between the positive bus-bar 1805 and the phase bus-bar 1815 or between the negative bus-bar 1810 and the phase bus-bar 1815.

Thus, the capacitor lead frame 405 can couple directly with the transistor leads 205 of the plurality of transistors 120. The half-bridge circuit 100 can be formed such that a distance between the transistors 120 and the capacitor 115 can be minimized as no laminated bus-bar or intermediate bus-bar is used to couple the capacitor lead frame 450 to the transistors 120. For example, the capacitor lead frame 405 can minimize the size of the inductance loop present in the half-bridge circuit 100.

Figure 20:
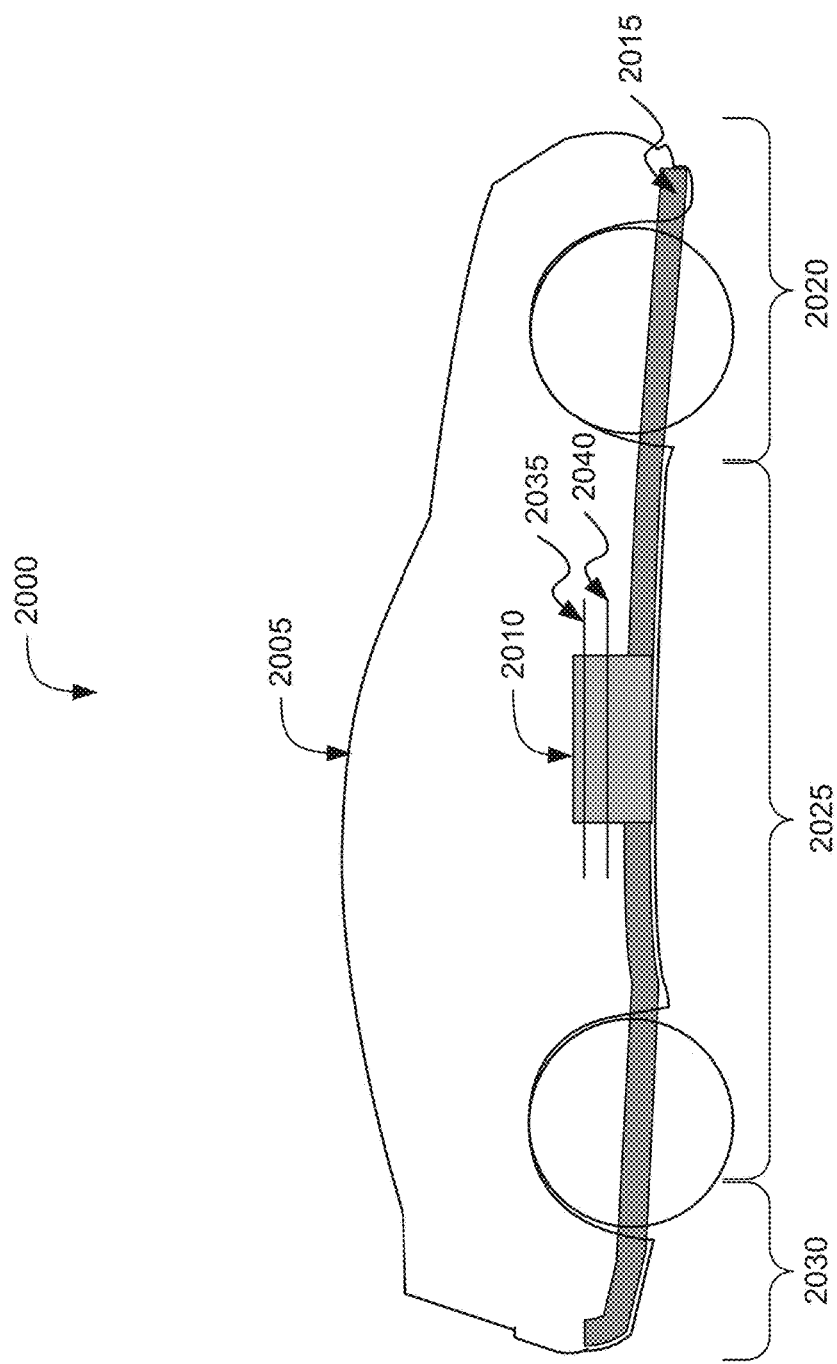
FIG. 20 is a block diagram depicting a cross-sectional view of an example electric vehicle installed with a battery pack.

FIG. 20 depicts an example cross-section view 2000 of an electric vehicle 2005 installed with a battery pack 2010. The electric vehicles 2005 can include an autonomous, semi-autonomous, or non-autonomous human operated vehicle. The electric vehicle 2005 can include a hybrid vehicle that operates from on-board electric sources and from gasoline or other power sources. The electric vehicle 2005 can include automobiles, cars, trucks, passenger vehicles, industrial vehicles, motorcycles, and other transport vehicles. The electric vehicle 2005 can include a chassis 2015 (sometimes referred to herein as a frame, internal frame, or support structure). The chassis 2015 can support various components of the electric vehicle 2005. The chassis 2015 can span a front portion 2020 (sometimes referred to herein a hood or bonnet portion), a body portion 2025, and a rear portion 2030 (sometimes referred to herein as a trunk portion) of the electric vehicle 2005. The front portion 2020 can include the portion of the electric vehicle 2005 from the front bumper to the front wheel well of the electric vehicle 2005. The body portion 2025 can include the portion of the electric vehicle 2005 from the front wheel well to the back wheel well of the electric vehicle 2005. The rear portion 2030 can include the portion of the electric vehicle 2005 from the back wheel well to the back bumper of the electric vehicle 2005.

The battery pack 2010 can be installed or placed within the electric vehicle 605. The battery pack 2010 can include or couple with a power converter component having an inverter 300. For example, the battery pack 2010 can couple with a drive train unit of the electric vehicle 605. The drive train unit may include components of the electric vehicle 605 that generate or provide power to drive the wheels or move the electric vehicle 605. The drive train unit can be a component of an electric vehicle drive system. The electric vehicle drive system can transmit or provide power to different components of the electric vehicle 605. For example, the electric vehicle drive train system can transmit power from the battery pack 2010 to axle or wheels of the electric vehicle 605. The battery pack 2010 can be installed on the chassis 2015 of the electric vehicle 2005 within the front portion 2020, the body portion 2025 (as depicted in FIG. 20), or the rear portion 2030. The battery pack 2010 can couple with a first bus-bar 2035 and a second bus-bar 2040 that are connected or otherwise electrically coupled with other electrical components of the electric vehicle 2005 to provide electrical power from the battery pack 2010.

Figure 21:
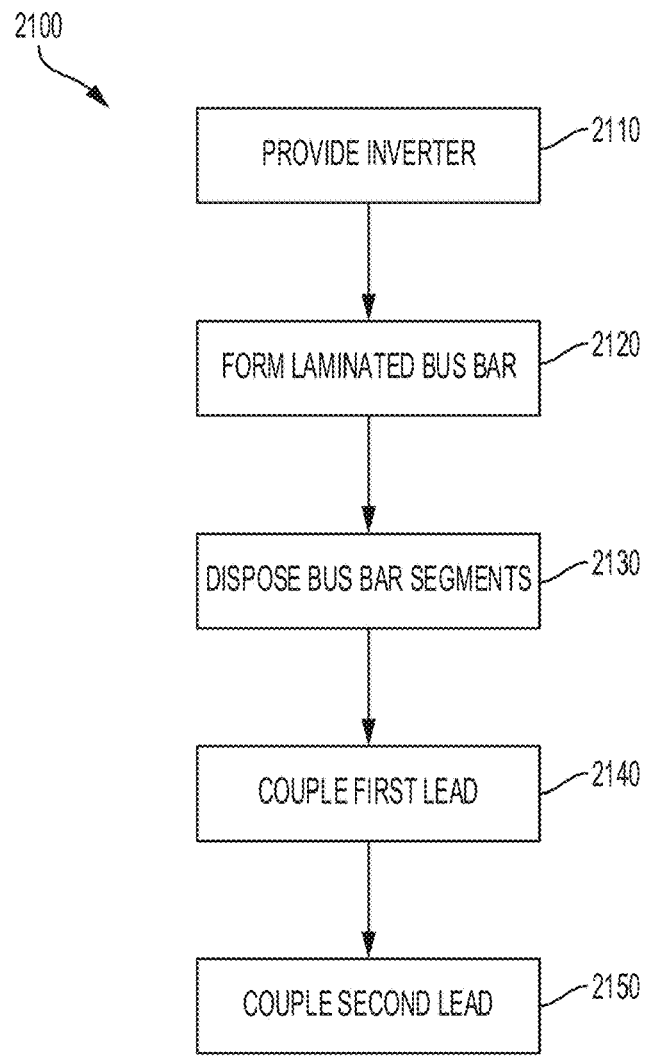
FIG. 21 is a flow diagram of a method for providing a power converter component to power a drive unit of an electric vehicle.

FIG. 21 depicts an example method 2100 of providing a power converter component 700 to power a drive unit of an electric vehicle is provided. The method 2100 includes providing an inverter 300 (ACT 2110). The inverter 300 can include a first transistor 120, a second transistor 120, and a capacitor 115.

The inverter 300 can include one or more half-bridge inverter circuits 100. Each of the half-bridge inverter circuits 100 can include a positive terminal 105 and a negative terminal 110 that form a loop. The capacitor 115 can be coupled between the positive terminal 105 and the negative terminal 110. The first transistor 120 includes a base terminal, a collector terminal coupled with the positive terminal 105 and an emitter terminal coupled with a phase terminal 130 and a collector terminal of a second transistor 120. The second terminal 125 includes a base terminal and an emitter terminal coupled with the negative terminal 110. The first transistor 120 and the second transistor 120 can operate as switches and provide a phase voltage through the phase terminal 130, for example, to a three phase motor or motor drive unit of an electrical vehicle.

The method 2100 can include forming at least one laminated bus bar 1860 (ACT 2120). The laminated bus-bar 1860 can be formed having a positive bus-bar segment 1805, a negative bus-bar segment 1810 and a phase bus-bar segment 1815. The laminated bus-bar 1860 can be formed such that it is integrated with, includes portions of, or forms the lead frame of the capacitor. For example, the laminated bus-bar 1860 includes the positive bus-bar segment 1805, the negative bus-bar segment 1810, and the phase bus-bar segment 1815.

The method 2100 can include disposing at least one bus bar segment 1805 (ACT 2130). The positive bus-bar segment 1805, the negative bus-bar segment 1810, and the phase bus-bar segment 1815 can be disposed about the capacitor 115 to form a lead frame 405 coupled with the capacitor 115. The capacitor lead frame 405 can correspond to the half bridge inverter circuit 100. For example, the positive bus-bar 1805 can correspond to the positive terminal 105, the negative bus-bar 1810 can correspond to the negative terminal 110, and the phase bus-bar 1815 can correspond to the phase terminal 130. The positive bus-bar 1805 and the negative bus-bar 1810 can electrically couple with the capacitor 115. For example, the positive bus-bar 1805 and the negative bus-bar 1810 can be disposed such that portions of the positive bus-bar 1805 and the negative bus-bar 1810 are in contract with portions of the capacitor 115.

The method 2100 can include coupling at least one first lead (ACT 2140). For example, a first lead 1840 of the lead frame 405 can couple with the first transistor 120. The first lead 1840 can include a portion of the positive bus-bar segment 1805 and a first portion of the phase bus-bar segment 1815. The method 2100 can include coupling at least one second lead (ACT 2150). For example, a second lead 1850 of the lead frame 405 can couple with the second transistor 120. The second lead 1850 can include a portion of the negative bus-bar 1810 and a second portion the phase bus-bar 1815. The leads of the first and second transistors 120 can couple directly with the leads of the capacitor lead frame 405.

The capacitor lead frame 405 can provide a closed inductance loop between the capacitor 115 and transistors 120 coupled with capacitor leads 430. For example, the capacitor lead frame 405 can make electrical connections (e.g., directly) to the transistors 120 through leads 430. Coupling the transistors 120 with the capacitor lead frame 405 can reduce the size of the inductance loop formed by the capacitor lead frame 405 relative to an inductance loop not having this coupling arrangement. For example, a distance between the transistors 120 and the capacitor 115 can be minimized as no laminated bus-bar or intermediate bus-bar is used to couple the capacitor lead frame 450 to the transistors 120. The minimized distance between the transistors 120 and the capacitor 115 can reduce unwanted electrical parasitics (e.g., loss and inductance) in the capacitor lead frame 405.

The capacitor lead frame 405 can include multiple insulation layers 1705 disposed to electrically isolate different elements or components of the capacitor lead frame 405 from each other. The spacing or gaps between the elements can correspond to a thickness of the insulation layer 1705. Thus, an overall size or the dimensions of the capacitor lead frame 405 and the inductance loop formed by the capacitor lead frame 405 can reduce the spacing or gaps between the different elements of the capacitor lead frame 405. For example, the capacitor lead frame 405 can be formed having a smaller or more compact design and can include fewer components, as one or more intermediate bus-bars are not needed to couple the capacitor lead frame 405 with the transistors 120.

Figure 22:
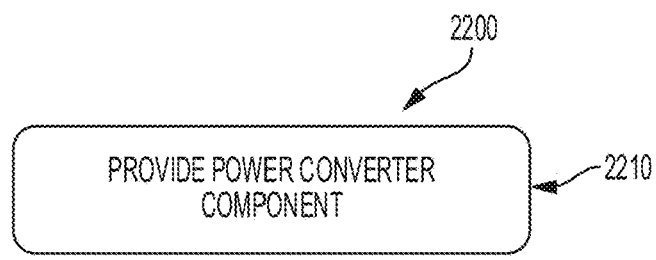
FIG. 22 is a flow diagram of a method for providing a power converter component to power a drive unit of an electric vehicle.

FIG. 22 depicts an example method 2200 of providing at least one power converter component 700 (ACT 2210). For example, the power converter component 700 can be provided to power at least one drive unit or drive system of an electric vehicle. The power converter component 700 includes an inverter 300. The inverter 300 can include a first transistor 120, a second transistor 120, and a capacitor 115. The power converter component 700 can include a laminated bus-bar 1860 having a positive bus-bar segment 1805, a negative bus-bar segment 1810 and a phase bus-bar segment 1815. The positive bus-bar segment 1805, the negative bus-bar segment 1810, and the phase bus-bar segment 1815 can be disposed about the capacitor 115 to form a lead frame 405 coupled with the capacitor 115. The lead frame 405 can include a first lead 1840 coupled with the first transistor 120. The first lead 1840 can include a portion of the positive bus-bar 1805 and a first portion of the phase bus-bar 1815. The lead frame 405 can include a second lead 1850 coupled with the second transistor 120. The second lead 1850 can include a portion of the negative bus-bar 1810 and a second portion the phase bus-bar 1815.

The power converter component 700 can include a capacitor 115 having a capacitor lead frame 405. A first transistor 120 can couple with a first surface 310 of the capacitor lead frame 405. The first transistor includes a first plurality of transistor leads 205 extending from a first side surface 340 of the capacitor lead frame 405. A second transistor 120 can couple with the first surface 310 of the capacitor lead frame 405. The second transistor 120 having a second plurality of transistor leads 205 extending from a second side surface 345 of the capacitor lead frame 405. A first input terminal 330 can couple with a first edge surface 320 of the capacitor 115. A second input terminal 335 can couple with the first edge surface 320 of the capacitor 115. The second input terminal 335 can be spaced from the first input terminal 330 a first distance along the first edge surface 320 of the capacitor 115 (or capacitor housing 305). An output terminal 325 can couple with a second edge surface 315 of the capacitor 115 (or capacitor housing 305).

Figure 23:
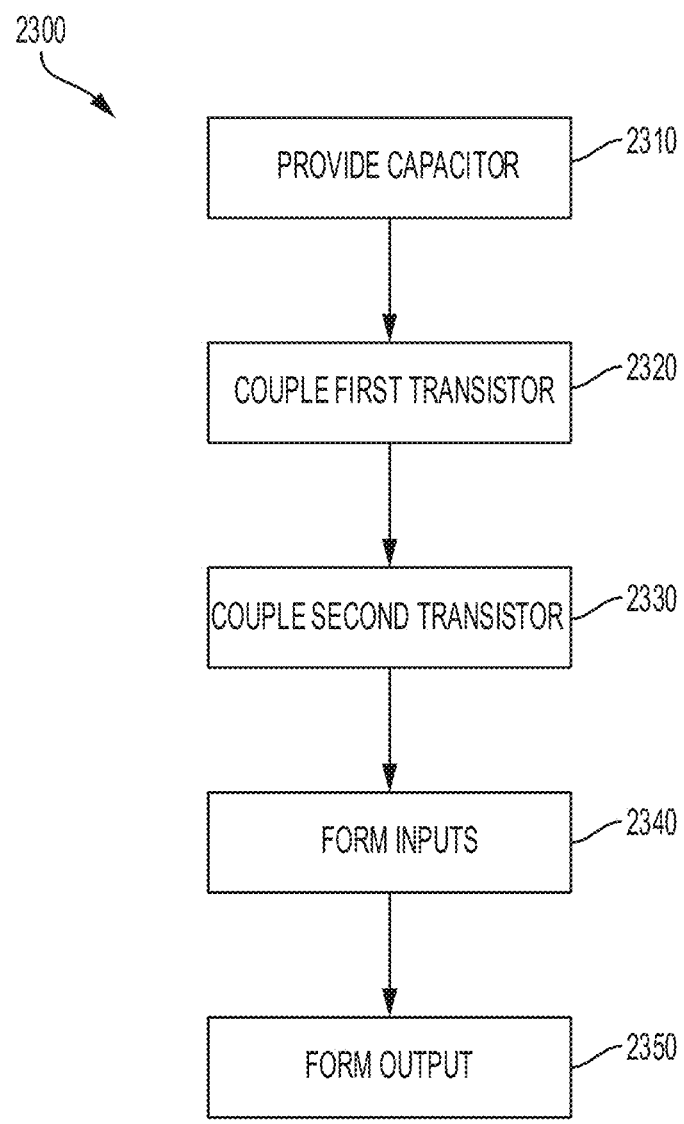
FIG. 23 is a flow diagram of a method for providing a power converter component to power a drive unit of an electric vehicle.

FIG. 23 depicts an example method 2300 of providing at least one power converter component to power an electric vehicle. The method 2300 can include providing at least one capacitor 115 (ACT 2310). The capacitor 115 can include a capacitor housing 305 and a capacitor lead frame 405. The capacitor housing 305 can correspond to or house an inverter 300 (e.g., capacitor package). The housing 305 can be formed be in a variety of different shapes. For example, the housing 305 can be formed having a rectangular shape, square shape, or circular shape. The housing 305 can include a first surface 310 (e.g., top surface, bottom surface), a second surface 360 (e.g., bottom surface, top surface), a first side surface 340, a second side surface 345, a first edge surface 315 and a second edge surface 320.

The method 2300 can include coupling at least one first transistor 120 with at least one capacitor 115 (ACT 2320). The first transistor 120 or a first plurality of transistors 120 can couple with a first surface 310 of the capacitor lead frame 405. The first transistor 120 can coupled with or be disposed along the first side surface 340 of the capacitor lead frame 405. For example, the first transistor 120 can include a first plurality of transistor leads 205 and be positioned such that the first leads 205 extend from the first side surface 340 of the capacitor lead frame 405. The first leads 205 can be formed having a variety of different shapes. The particular shape of the first leads 205 can be determined or selected to accommodate coupling with other electrical components of an inverter 300. For example, the first leads 205 can be formed having a straight shape, curved shape or bent shape to accommodate coupling with a printed circuit board.

The method 2300 can include coupling at least one second transistor with the capacitor 115 (ACT 2330). The second transistor 120 or a second plurality of transistors 120 can couple with the first surface 310 of the capacitor lead frame 405. The second transistor 120 can coupled with or be disposed along the second side surface 345 of the capacitor lead frame 405. For example, the second transistor 120 can include a second plurality of transistor leads 205 and be positioned such that the second leads 205 extend from the second side surface 345 of the capacitor lead frame 405. The second leads 205 can be formed having a variety of different shapes. The particular shape of the second leads 205 can be determined or selected to accommodate coupling with other electrical components of an inverter 300. For example, the second leads 205 can be formed having a straight shape, curved shape or bent shape to accommodate coupling with a printed circuit board.

The transistors 120 and leads 205 can be arranged along the first surface 310 in a variety of different arrangements. The first plurality of transistors 120 can be spaced from the second plurality of transistors 120 along the first surface 310. For example, the first plurality of transistors 120 can be arranged or organized in a first row adjacent to or along the first side surface 340 and the second plurality of transistors 120 can be arranged or organized in a second row adjacent to or along the second side surface 345. The first row of transistors 120 can be spaced from the second row of transistors 120 a distance selected based in part on the dimensions of the first surface 310.

The method 2300 can include forming at least one input terminal (ACT 2340). For example, a first input terminal 330 can be formed on a first edge surface 320 of the capacitor 115 or capacitor housing 305. A second input terminal 335 can be formed on the first edge surface 320 of the capacitor 115 or capacitor housing 305. The input terminals can be formed such that the second input terminal 335 is spaced from the first input terminal 330 by a first distance or predetermined distance. The distance between the second input terminal 335 and the first input terminal 330 can be selected to provide spatial separation between cells such that creepage or clearance (creepage-clearance) requirements are met or exceeded.

The first input terminal 330 may correspond to a positive input terminal and the second input terminal 335 may correspond to a negative input terminal. The first input terminals 330 and the second input terminal 335 can be formed using conductive material. The first and second input terminals 330, 335 can be formed in a variety of different shapes to accommodate coupling with transistor lead frames or coupling with other inverters 300 within a drive train unit of an electrical vehicle. The first and second input terminals 330, 335 can be formed having a straight shape, or a curved or bent shape to accommodate coupling over portions of the first surface 310 or edge surfaces 315, 320 of the capacitor housing 305.

Each of the first and second input terminals 330, 335 can be formed having multiple portions. For example, each of the first and second input terminals 330, 335 can include a first portion 380 that is parallel with the first surface 310 and a second portion 385 that is perpendicular with respect to the first surface 310 and parallel with the edge surface 315. For example, the first and second input terminals 330, 335 can have a "U" shape.

The method 2300 can include forming at least one output terminal (ACT 2350). For example, an output terminal 325 can be formed on a second edge surface 315 (e.g., different from edge surface 320) of the capacitor 115 or capacitor housing 305. The output terminal 325 can be configured as an output terminal or phase terminal to provide power (e.g., voltage) generated by an inverter 300 to other electrical components of an electric vehicle. The output terminal 325 can be formed using conductive material, such as but not limited to copper. The output terminal 325 can be formed in a variety of different shapes to accommodate coupling with transistor lead frames or coupling with other inverters 300 within a drive train unit of an electrical vehicle. The output terminal 325 can be formed having a straight shape, or a curved or bent shape to accommodate coupling over portions of the first surface 310 or edge surfaces 315, 320 of the capacitor housing 305. The output terminal 325 can include multiple portions having different shapes. For example, the output terminal 325 can include a first portion 370 that is parallel with the first surface 310 and a second portion 375 that is perpendicular with respect to the first surface 310 and parallel with the edge surface 315.

The transistors 120 can include plug-and-play modules with bolt-on terminals, to discreet board-level devices in standard packages or formats, to bare dies which may be custom packaged by the original equipment manufacturers with the appropriate manufacturing equipment or capital. Packages that include transistors 120, capacitors 115, and bus-bars 1805, 1810, 1815 to generate AC signals to drive AC motors without consolidating the DC and AC bus-bars into the capacitor may lack the advantages described herein. Further, capacitor packages without lead frames designed to interface with discreet transistor devices may lack the advantages described herein.

The systems and methods described herein can employ automotive transistors 120 such as TO-247s (among others) as a cost effective solution suitable for high-performance electrical vehicles. One advantage of using discreet transistor devices is that one can scale up the current-carrying capacity (and the power output of an electrical vehicle) by arranging more devices in parallel. The TO 247s and similar discreet devices employed herein can provide engineering (and also marketing) flexibility. Advantages are numerous, though the engineering required to package inverters based on discreet devices can be more demanding than IGBT modules. The systems and methods described herein include a packaging innovation for TO-247-based inverter packages.

There are technical challenges that pertain to automotive, industrial, or commercial inverter power converter modules. One technical challenge is the task of packaging transistors 120 (e.g., TO-247 transistors) and capacitors 115 (e.g., DC-link capacitors, X capacitors), and bus-bars 1805, 1810, 1815 relative to one another, such that power density over the overall inverter package 300 is maximized, such that a low cost and ease of assembly is achieved, and such that unwanted electrical parasitics (e.g., loss and inductance) are minimized in the inverter circuit 100.

For high-power applications, packaging solutions may entail separate component groups, such as but not limited to, the transistors 120, bus-bars/conductors 1805, 1810, 1815, and capacitors 115. A laminated bus-bar can be used as an intermediate electrical connection between the lead frames of the transistors 120 and the lead frame(s) of the capacitors 115. Having three separate component groups may necessitate mechanical clearances between parts for reasons including design for assembly or prevention of arcing between high voltage conductors with other conductors. Further, longer conductor lengths can be required to reach all the inverter circuit components (e.g., transistors 120, capacitors 115).

The systems and methods described herein can integrate the laminated bus-bar (e.g., containing positive, negative, and phase bus-bars) into the lead frame of a capacitor, in such a way that the resulting capacitor lead frame can be directly connected to transistor lead frames by means of soldering or resistive welding. Further, the bolted input/output terminals of the capacitor can serve as the inverter circuit inputs and outputs.

When, for example, the capacitor lead frame is electrically connected to the transistors 120, the resulting circuit 100 can include a half bridge inverter. The phase conductor of this circuit can be arranged butting up against the side of the capacitor elements/bobbins, separated by a layer of insulating film. The phase conductor can be laminated and insulated against the positive and negative conductors as they exit the capacitor body.

This arrangement of capacitor elements and conductors minimizes the size of the inductance loop present in the circuit. This arrangement of capacitor elements and conductors minimizes distance and maintains equidistance between the capacitor elements and transistor dies, both the high side and low side. Electrical loss is in this example minimal and uniform across all insulated gate bipolar transistors (IGBTs). The capacitor and the previously intermediate bus-bars can be one homogenous part, sharing structure, insulation, mounting points, and heat dissipation surfaces. The mechanical tolerance stack-up between the X capacitor and laminated bus-bar can be eliminated. The capacitor case can provide the bus-bars with the structural backing or support needed to compress thermal pads against heat dissipation surfaces in a single assembly step, in contrast with a technique that uses separate plastic brackets/clips to this fulfill this roll. Part count is thus further reduced in the context of the assembly. Further, cost is reduced for purchased component as well as in-house assembly/labor. This assembly also accomplishes weight reduction. For example, approximately 30% less copper can be used when the capacitor and laminated bus-bar are combined. Several fasteners and layers of insulation film can also be eliminated.

The DC-Link, Single-Phase Capacitors ("DCLSP Capacitors") can be used as X capacitors/DC-Link filtering capacitors or automotive/industrial/commercial inverters. The bus-bars in the capacitor can serve as the conducting paths.

IGBT modules can be provided with capacitors with matching lead frames that can directly be bolted together. These capacitors can have a DC input bus integrated into the capacitor body. This can result in the advantages described herein as well. The capacitor packages described herein can incorporate the DC bus and the AC bus, both of which can be directly connected to an arrangement of discreet TO-247 transistors/IGBTs.

A method of interfacing DC and AC bus-bars to TO-247s and capacitors can include an intermediate conductor in the form of a laminated bus-bar. Having a separate bus-bar assembly from the capacitor lead frame offers relatively low inductance and high current capacity. For low-power applications, a PCB can be used in the place of a laminated bus-bar. Capacitors and TO-247s could be thru-hole or SMD mounted. Electrical connections can be soldered. Due to thermal limitations, such designs can be better suited for low-power applications. Smaller or more densely packaged capacitors could be used, such as filtering capacitors that can be nested inside IGBT modules alongside the semiconductor chips, sharing the same lead frame as the semiconductor dies. The result would be an equivalent circuit, but potentially more compact.

A bus-bar carrying current that is constantly in flux (ex. AC bus in an inverter) can be laminated against other bus-bars to reduce parasitic inductance. Further, a single DC-Link Single Phase (DCLSP) Capacitor can be connected to TO-247s to form a half bridge inverter circuit. This assembly makes up part of a single power stage in a traction inverter assembly. There can be three power stages in a 3-phase traction inverter.

While operations are depicted in the drawings in a particular order, such operations are not required to be performed in the particular order shown or in sequential order, and all illustrated operations are not required to be performed. Actions described herein can be performed in a different order.

Having now described some illustrative implementations, it is apparent that the foregoing is illustrative and not limiting, having been presented by way of example. Features that are described herein in the context of separate implementations can also be implemented in combination in a single embodiment or implementation. Features that are described in the context of a single implementation can also be implemented in multiple implementations separately or in various sub-combinations. References to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any act or element may include implementations where the act or element is based at least in part on any act or element.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular can also embrace implementations including a plurality of these elements, and any references in plural to any implementation or element or act herein can also embrace implementations including only a single element. References in the singular or plural form are not intended to limit the presently disclosed systems or methods, their components, acts, or elements to single or plural configurations. References to any act or element being based on any information, act or element can include implementations where the act or element is based at least in part on any information, act, or element.

Any implementation disclosed herein can be combined with any other implementation or embodiment, and references to "an implementation," "some implementations," "one implementation" or the like are not necessarily mutually exclusive and are intended to indicate that a particular feature, structure, or characteristic described in connection with the implementation can be included in at least one implementation or embodiment. Such terms as used herein are not necessarily all referring to the same implementation. Any implementation can be combined with any other implementation, inclusively or exclusively, in any manner consistent with the aspects and implementations disclosed herein.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B' can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

The systems and methods described herein can be embodied in other specific forms without departing from the characteristics thereof. Scope of the systems and methods described herein is thus indicated by the appended claims, rather than the foregoing description, and changes that come within the meaning and range of equivalency of the claims are embraced therein.

Systems and methods described herein may be embodied in other specific forms without departing from the characteristics thereof. For example, descriptions of positive and negative electrical characteristics may be reversed. For example, elements described as negative elements can instead be configured as positive elements and elements described as positive elements can instead by configured as negative elements. Further relative parallel, perpendicular, vertical or other positioning or orientation descriptions include variations within +/−10% or +/−10 degrees of pure vertical, parallel or perpendicular positioning. References to "approximately," "about" "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

What is claimed is:

1. A power converter component to power a drive unit of an electric vehicle, comprising:
   an inverter, the inverter having a first transistor, a second transistor, and a capacitor;
   a laminated bus-bar having a positive bus-bar segment, a negative bus-bar segment and a phase bus-bar segment;
   the positive bus-bar segment, the negative bus-bar segment, and the phase bus-bar segment disposed about the capacitor to form a lead frame coupled with the capacitor;
   the lead frame having a first lead coupled with the first transistor, the first lead including a portion of the positive bus-bar segment and a first portion of the phase bus-bar segment; and
   the lead frame having a second lead coupled with the second transistor, the second lead including a portion of the negative bus-bar segment and a second portion the phase bus-bar segment.

2. The power converter component of claim 1, comprising:
   the first lead coupled with a first transistor lead frame of the first transistor; and
   the second lead coupled with a second transistor lead frame of the second transistor.

3. The power converter component of claim 1, comprising
   the first lead coupled with a first transistor lead frame of the first transistor and not coupled with a first intermediate bus-bar between the first transistor and the lead frame; and
   the second lead coupled with a second transistor lead frame of the second transistor and not coupled with a second intermediate bus-bar between the second transistor and the lead frame.

4. The power converter component of claim 1, comprising:
   the first lead coupled with a first transistor lead frame of the first transistor through at least one of a first soldered connection and a first resistive welded connection; and
   the second lead coupled with a second transistor lead frame of the second transistor through at least one of a second soldered connection and a second resistive welded connection.

5. The power converter component of claim 1, comprising:
   an insulation layer disposed between the phase bus-bar segment and the capacitor; and a first distance between the phase bus-bar segment and the capacitor corresponding to a thickness of the insulation layer disposed between the phase bus-bar segment and the capacitor.

6. The power converter component of claim 1, comprising:
   one or more insulation layers disposed between the phase bus-bar segment and the positive bus-bar segment, and between the phase bus-bar segment and the negative bus-bar segment;
   a second distance between the phase bus-bar segment and the positive bus-bar segment corresponding to a thickness of the one or more insulation layers disposed between the phase bus-bar segment and the positive bus-bar segment, and
   a third distance between the phase bus-bar segment and the negative bus-bar segment corresponding to the thickness of the one or more insulation layers disposed between the phase bus-bar segment and the negative bus-bar segment.

7. The power converter component of claim 1, comprising:
   portions of the phase bus-bar segment disposed within a body of the capacitor.

8. The power converter component of claim 1, comprising:
   the first and second transistors and the capacitor forming a half-bridge inverter circuit for a power converter.

9. The power converter component of claim 1, comprising:
   the capacitor having a first input and a second input that operate as inputs to a half-bridge inverter circuit of the power converter; and
   the capacitor having an output that operates as an output of the half-bridge inverter circuit.

10. The power converter component of claim 1, comprising:
    an epoxy layer disposed about the positive bus-bar segment, the negative bus-bar segment and the phase bus-bar segment.

11. The power converter component of claim 1, comprising:
    an inductance loop formed by the capacitor, the first transistor and second transistor, the inductance loop having an inductance value based on a distance between the laminated bus-bar and the capacitor; and
    an insulation layer disposed between the laminated bus-bar and the capacitor, the insulation layer in contact with the laminated bus-bar and the capacitor.

12. The power converter component of claim 1, comprising:
    an inductance loop formed by the capacitor, the first transistor and second transistor, the inductance loop having an inductance value based on a distance between the laminated bus-bar and the capacitor; and
    the inductance value ranging from 10 nanohenries to 15 nanohenries.

13. The power converter component of claim 1, comprising:

the laminated bus-bar including a DC bus-bar and an AC bus-bar.

14. The power converter component of claim 1, comprising:
the power converter component provided in a drive unit.

15. The power converter component of claim 1, comprising:
the power converter component provided in a drive unit of an electric vehicle.

16. The power converter component of claim 1, comprising:
the power converter component provided in an electric vehicle and configured to provide electrical power to a drive unit of the electric vehicle.

17. The power converter component of claim 1, comprising:
the positive bus-bar segment, the negative bus-bar segment, and the phase bus-bar segment integrally formed with the lead frame of the capacitor.

18. A method of providing a power converter component to power a drive unit of an electric vehicle, comprising:
providing an inverter, the inverter having a first transistor, a second transistor, and a capacitor;
forming a laminated bus-bar having a positive bus-bar segment, a negative bus-bar segment and a phase bus-bar segment;
disposing the positive bus-bar segment, the negative bus-bar segment, and the phase bus-bar segment about the capacitor to form a lead frame coupled with the capacitor;
coupling a first lead of the lead frame with the first transistor, the first lead including a portion of the positive bus-bar segment and a first portion of the phase bus-bar segment; and
coupling a second lead of the lead frame with the second transistor, the second lead including a portion of the negative bus-bar segment and a second portion the phase bus-bar segment.

19. The method of claim 18, comprising:
disposing a first insulation layer between the phase bus-bar segment and the capacitor such that a first distance between the phase bus-bar segment and the capacitor corresponds to a first thickness of the insulation layer disposed between the phase bus-bar segment and the capacitor;
disposing a second insulation layer between the phase bus-bar segment and the positive bus-bar segment such that a second distance between the phase bus-bar segment and the positive bus-bar segment corresponds to a second thickness of the second insulation layer disposed between the phase bus-bar segment and the positive bus-bar segment; and
disposing a third insulation layer between the phase bus-bar segment and the negative bus-bar segment such that a third distance between the phase bus-bar segment and the negative bus-bar segment corresponds to a third thickness of the third insulation layer disposed between the phase bus-bar segment and the negative bus-bar segment.

20. A method, comprising:
providing a power converter component to power a drive unit of an electric vehicle, the power converter component comprising:
an inverter, the inverter having a first transistor, a second transistor, and a capacitor;
a laminated bus-bar having a positive bus-bar segment, a negative bus-bar segment and a phase bus-bar segment;
the positive bus-bar segment, the negative bus-bar segment, and the phase bus-bar segment disposed about the capacitor to form a lead frame coupled with the capacitor;
the lead frame having a first lead coupled with the first transistor, the first lead including a portion of the positive bus-bar segment and a first portion of the phase bus-bar segment; and
the lead frame having a second lead coupled with the second transistor, the second lead including a portion of the negative bus-bar segment and a second portion the phase bus-bar segment.

* * * * *